(12) United States Patent
Yamamoto et al.

(10) Patent No.: US 8,058,951 B2
(45) Date of Patent: Nov. 15, 2011

(54) SHEET-LIKE COMPOSITE ELECTRONIC COMPONENT AND METHOD FOR MANUFACTURING SAME

(75) Inventors: Kenichi Yamamoto, Osaka (JP); Daido Komyoji, Nara (JP); Keizaburo Kuramasu, Kyoto (JP)

(73) Assignee: Panasonic Corporation, Osaka (JP)

( * ) Notice: Subject to any disclaimer, the term of this patent is extended or adjusted under 35 U.S.C. 154(b) by 720 days.

(21) Appl. No.: 11/997,178

(22) PCT Filed: Sep. 22, 2006

(86) PCT No.: PCT/JP2006/318823
§ 371 (c)(1),
(2), (4) Date: Jan. 29, 2008

(87) PCT Pub. No.: WO2007/040064
PCT Pub. Date: Apr. 12, 2007

(65) Prior Publication Data
US 2010/0090781 A1    Apr. 15, 2010

(30) Foreign Application Priority Data
Sep. 30, 2005    (JP) ................................ 2005-288067

(51) Int. Cl.
*H03H 7/00* (2006.01)
(52) U.S. Cl. ........................................ 333/185; 333/184
(58) Field of Classification Search .................. 333/185, 333/172, 184
See application file for complete search history.

(56) References Cited

U.S. PATENT DOCUMENTS

| | | | |
|---|---|---|---|
| 5,363,081 A * | 11/1994 | Bando et al. | ................... 336/200 |
| 5,942,965 A | 8/1999 | Kitamura et al. | |
| 6,362,434 B1 * | 3/2002 | Yoshida et al. | ................ 174/256 |
| 6,570,469 B2 * | 5/2003 | Yamada et al. | ................ 333/193 |
| 6,713,162 B2 * | 3/2004 | Takaya et al. | ................. 428/209 |
| 6,803,324 B2 | 10/2004 | Ogawa et al. | |
| 6,872,893 B2 | 3/2005 | Fukuoka et al. | |

(Continued)

FOREIGN PATENT DOCUMENTS
CN    1392756    1/2003
(Continued)

OTHER PUBLICATIONS

International Search Report issued Dec. 26, 2006 in the International (PCT) Application of which the present application is the U.S. National Stage.

(Continued)

*Primary Examiner* — Robert Pascal
*Assistant Examiner* — Kimberly Glenn
(74) *Attorney, Agent, or Firm* — Wenderoth, Lind & Ponack, L.L.P.

(57) ABSTRACT

A configuration includes a first sheet substrate, on which a first thin film electronic component is formed on at least one main face, and an external connection terminal for connecting to an external circuit is formed one main face or the other face; a second sheet substrate, on which a second thin film electronic component is formed on at least one face; an insulator connection resin layer for fixing the first sheet substrate and the second sheet substrate opposing the first thin film electronic component against the second thin film electronic component; and an interlayer connection conductor for electrically connecting electrode terminals, which have been set in advance, of the first thin film electronic component and the second thin film electronic component.

9 Claims, 16 Drawing Sheets

U.S. PATENT DOCUMENTS

| | | |
|---|---|---|
| 7,100,276 B2 | 9/2006 | Fukuoka et al. |
| 7,187,250 B2 * | 3/2007 | Matters-Kammerer et al. ............................ 333/116 |
| 7,268,645 B2 * | 9/2007 | Meltzer et al. ................ 333/175 |
| 7,679,925 B2 | 3/2010 | Fukuoka et al. |
| 2002/0167783 A1 | 11/2002 | Waffenschmidt et al. |

FOREIGN PATENT DOCUMENTS

| | | |
|---|---|---|
| JP | 7-122430 | 5/1995 |
| JP | 9-129449 | 5/1997 |
| JP | 9-171949 | 6/1997 |
| JP | 9-232162 | 9/1997 |
| JP | 9-289128 | 11/1997 |
| JP | 10-163635 | 6/1998 |
| JP | 2002-164467 | 6/2002 |
| JP | 2002-344106 | 11/2002 |
| JP | 2003-059721 | 2/2003 |
| JP | 2003-92460 | 3/2003 |
| JP | 2004-193319 | 7/2004 |
| JP | 2004-311987 | 11/2004 |
| JP | 2005-045112 | 2/2005 |

OTHER PUBLICATIONS

English (Machine) translation of JP 09-289128, published Nov. 1997.

* cited by examiner

SHEET-LIKE COMPOSITE ELECTRONIC COMPONENT AND METHOD FOR MANUFACTURING SAME

This application is a U.S. national phase application of PCT International Application PCT/W2006/318823, filed Sep. 22, 2006.

TECHNICAL FIELD

The present invention relates to a composite electronic component having a plurality of thin film electronic components having different functions mounted on a flexible sheet-like base material, particularly, a sheet-like composite electronic component (hereinafter, referred to as "a composite electronic component") including a thin-type LC circuit and a CR circuit, and a method for manufacturing same.

BACKGROUND ART

In recent years, in accordance with reduction in size, reduction in thickness, and high performance of mobile terminal equipment represented by a mobile phone, the further reduction in thickness and the further reduction in size of a chip component of an electronic component have been required. However, with mere reduction in size and mere reduction in thickness of the chip component, it is expected that there will be great difficulty in performing a manufacturing step such as mounting of the chip components on a circuit substrate or the like.

On the contrary, in Unexamined Japanese Patent Publication No. 9-171959, an electronic component having an organic film of a predetermined size and a plurality of functional components mounted on this film in a predetermined order and a method for manufacturing thereof are disclosed. This method for manufacturing the electronic component is characterized by having a first feeding step for feeding a tape with a predetermined width, a second feeding step for feeding a plurality of tapes on which the functional components are mounted, and a mounting step for mounting a plurality of functional components on a tape to be supplied in the first feeding step in a predetermined order.

In this composite electronic component, a resistor, a capacitor, and an inductor or the like are mounted in plural on one piece of a unit substrate. Accordingly, as compared to a method for individually mounting an electronic component manufactured individually, for example, a chip component or the like on a circuit substrate, this composite electronic component can be made with high density. However, this composite electronic component is composed in such a manner that the electronic components formed by a thin film are aligned on a flat surface and in such an arrangement configuration on a flat surface, there is a limitation in an integration degree of the electronic component.

On the contrary, in Unexamined Japanese Patent Publication No. 2005-45112, for example, it is disclosed that the electronic components are laminated and formed on a base material to be made into a three-dimensional configuration. This component-incorporated flexible circuit substrate has a base material made of a flexible heat-resistant resin film; and at least one piece of a thin film passive component configured by sandwiching a functional thin film formed by using any material of a dielectric body, a resistor, and a conductor by a first electrode circuit wiring and a second electrode circuit wiring, which are formed by a conductor thin film. Then, the component-incorporated flexible circuit substrate is configured in such a manner that the film thickness of any of the first electrode circuit wiring, the second electrode circuit wiring, and the functional thin film is thinner than that of the base material and a plurality of layers of the thin film passive components is laminated on the base material to form a passive component lamination.

This component-incorporated flexible circuit substrate uses a technique to directly form a functional thin film such as a capacitor and a resistor of a thickness not more than 1 µm on a thin organic film base material, and as compared to a conventional chip component, it is possible to make the thickness into about 1/100. Further, if a base material that is thin and flexible is used, it is also possible to arrange a device in limited space. In addition, by laminating the sheets having a device function with each other and connecting them, a wiring length between the devices can be made very short, so that transmission loss of a high frequency signal can be reduced. Further, since a plurality of passive components can be laminated, it is possible to largely improve the freedom of design of a circuit.

In the Unexamined Japanese Patent Publication No. 9-171959, since each electronic component is formed by a thin film forming method or a printing method, as compared to a conventional chip component, each electronic component can be made largely thin. In addition, by examining individual electronic components in advance or trimming them, properties of the individual electronic components can be adjusted, so that only a good-quality product is mounted on a master tape to be made into a composite electronic component. However, according to this example, an electronic component of a flat surface configuration to align and mount respective electronic components on a flat surface is only obtained.

On the other hand, in Unexamined Japanese Patent Publication No. 2005-45112, since the electronic components are laminated three-dimensionally by using the thin film forming method, reduction in size and reduction in thickness of the electronic component can be made. Although, according to this example, for example, an example that a capacitor, capacitors with each other, or a capacitor and an inductor are laminated is indicated, in order to laminate them by using the thin film forming method, a film formation step and a pattern processing step should be repeated many times, so that the step is made very complex. In addition, the case that the previously manufactured thin film electronic component becomes defective due to the influence of a manufacturing step of the thin film electronic component to be laminated on this is easily generated. For example, in the case of forming a resistor on the capacitor that has been manufactured previously, short-circuiting of a capacitor and deterioration of a property are easily generated by heating when forming the resistor and etching to make a predetermined pattern or the like. As a result, a yield rate as a laminated finished component-incorporated flexible circuit substrate is made low, so that there is a problem that the cost becomes high.

SUMMARY OF THE INVENTION

A composite electronic component according to the present invention may comprise a configuration including a first sheet substrate, on which a first thin film electronic component is formed on at least one main face and an external connection terminal for connecting to an external circuit is formed on the one main face or the other main face; a second sheet substrate, on which a second thin film electronic component is formed on at least one main face; and an insulating adhesive resin layer for fixing the first sheet substrate and the second sheet substrate opposing the first thin film electronic component against the second thin film electronic component.

According to this configuration, by laminating electronic components made of a plurality of thin film electronic components, a sheet-like composite electronic component can be formed, so that, as compared to a configuration that electronic components are arranged on a flat surface, reduction in size is more available. Further, since the thin film electronic components are very thin as compared to the chip components that are generally used, even if they are laminated, the thickness thereof can be made thinner than that of the chip component or the like. Therefore, reduction in thickness is possible in addition to reduction in size.

In addition, a method for manufacturing a sheet-like composite electronic component according to the present invention comprises a method including the steps of forming a plurality of first thin film electronic components on at least one main face of a first resin sheet, and an external connection terminal for connecting to an external circuit on the main face or the other face; forming a second thin film electronic component on at least one main face of a second resin sheet and on a position corresponding to the first thin film electronic component; electrically and mechanically connecting an interlayer connection conductor on an electrode terminal, which has been set in advance, of the first thin film electronic component or the second thin film electronic component; positioning and pressurizing the first thin film electronic component and the second thin film electronic component, electrically connecting respective electrode terminals between the first thin film electronic component and the second thin film electronic component by the interlayer connection conductor, and fixing the first resin sheet and the second resin sheet by an insulating adhesive resin layer; and cutting the first resin sheet and the second resin sheet to make a composite electronic component.

According to this method, since the first thin film electronic component and the second thin film electronic component are divided into the first resin sheet and the second resin sheet to be formed, respectively, each step can be simplified. Further, the adhering and the interlayer electrical connection are carried out collectively, and then, the first resin sheet and the second resin sheet are cut to manufacture a composite electronic component, so that it is possible to prevent a defect in manufacturing and the composite electronic component can be manufactured with a good yield rate.

DETAILED DESCRIPTION OF THE INVENTION

Hereinafter, the exemplary embodiments of the present invention will be described in detail with reference to the drawings. The same elements may be provided with the same reference marks and the explanation thereof may be omitted. In addition, in a plan view, in order to facilitate understanding, some layers may be shown being omitted or notched.

First Exemplary Embodiment

Figure 1A:
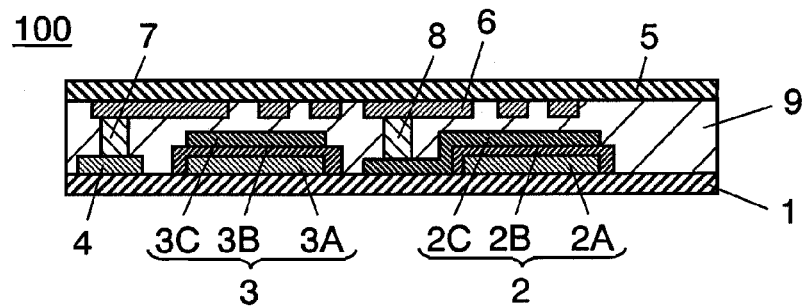
FIG. 1A is a substantial part cross sectional view of a composite electronic component according to a first exemplary embodiment of the present invention.
Figure 1B:
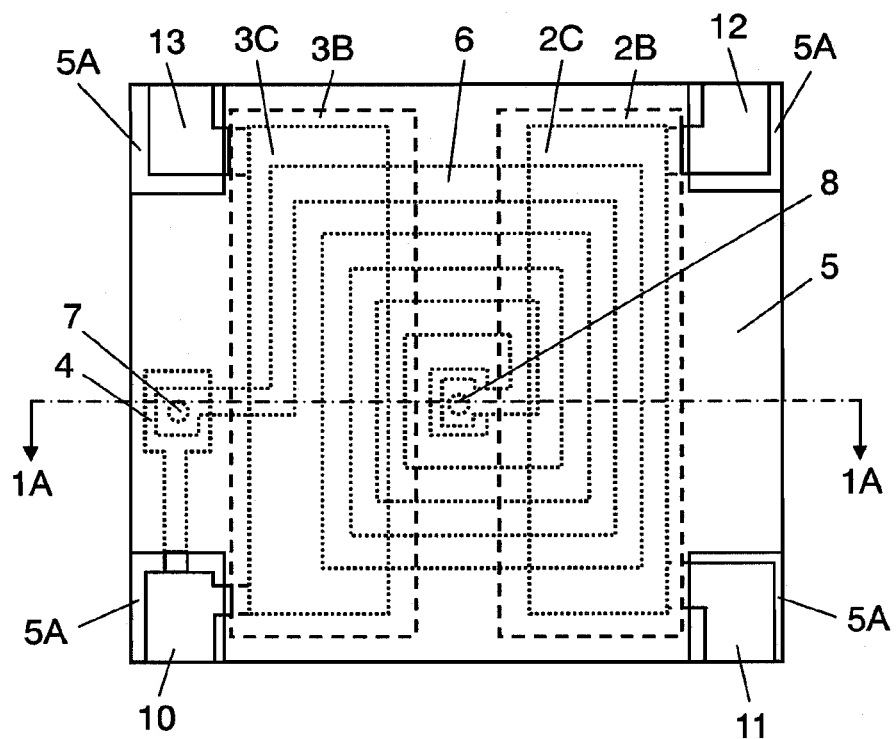
FIG. 1B is a plan view of a composite electronic component according to the first exemplary embodiment of the present invention.
Figure 1C:
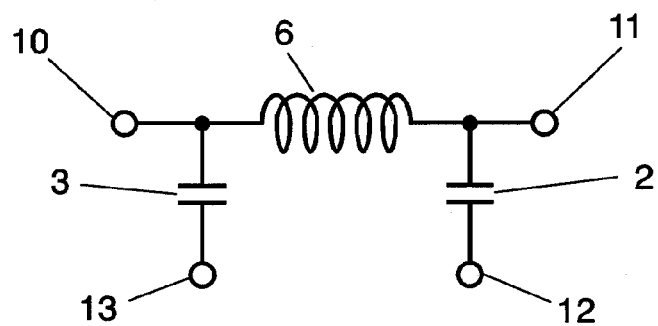
FIG. 1C is an equivalent circuit diagram of a composite electronic component according to the first exemplary embodiment of the present invention.

FIG. 1A to FIG. 1C show the configuration of composite electronic component 100 according to a first embodiment of the present invention, and FIG. 1A is a substantial part cross sectional view, FIG. 1B is a plan view, and FIG. 1C is an equivalent circuit diagram. Further, FIG. 1A shows a cross sectional view taken along line 1A-1A of FIG. 1B.

As shown in FIG. 1A and FIG. 1B, composite electronic component 100 according to the present exemplary embodiment is provided with first sheet substrate 1, second sheet substrate 5, and insulating adhesive resin layer 9 for fixing first sheet substrate 1 to second sheet substrate 5. In first sheet substrate 1, first thin film electronic components 2 and 3 are formed on at least one main face, and external connection terminals 10, 11, 12, and 13 for connecting to the external circuit are formed on this one main face or the other main face. In addition, in second sheet substrate 5, second thin film electronic component 6 is formed on at least one main face. Then, insulating adhesive resin layer 9 adheres and fixes first sheet substrate 1 and second sheet substrate 5 with first thin film electronic components 2 and 3 and second thin film electronic component 6 being opposed to each other.

Further, according to the present exemplary embodiment, in order to electrically connect the electrode terminals, which have been determined in advance, of first thin film electronic components 2 and 3 and second thin film electronic component 6, interlayer connection conductors 7 and 8 are further arranged.

That is, on one main face of first sheet substrate 1, two capacitor elements as first thin film electronic components 2 and 3 are arranged. Hereinafter, first thin film electronic components 2 and 3 will be described as capacitor elements 2 and 3. One capacitor element 2 is formed of lower electrode layer 2A, dielectric layer 2B, and upper electrode layer 2C. In the same way, another capacitor element 3 is also formed of lower electrode layer 3A, dielectric layer 3B, and upper electrode layer 3C.

Lower electrode layer 2A of one capacitor element 2 has a wiring pattern, which is elongated to be connected to external connection terminal 12. Further, upper electrode layer 2C is connected to a capacitor electrode terminal that is arranged on a position corresponding to another terminal of second thin film electronic component 6 and external connection terminal 11 when pasting second sheet substrate 5.

In addition, lower electrode layer 3A of another capacitor element 3 has a wiring pattern, which is elongated to be connected to external connection terminal 13. Further, upper electrode layer 3C is connected to external connection terminal 10, and this external connection terminal 10 is connected to capacitor electrode terminal 4 by a wiring conductor.

In addition, on second sheet substrate 5, an inductor element as second thin film electronic component 6 is formed. Hereinafter, second thin film electronic component 6 will be described as inductor element 6. This inductor element 6 is composed of a spiral-shaped configuration that is formed of a conductor. One electrode terminal of this inductor element 6 is elongated to a position corresponding to capacitor electrode terminal 4 of first sheet substrate 1. In addition, the other electrode terminal is arranged at a position that is a center of a spiral coil and corresponds to the capacitor electrode terminal connected to upper electrode layer 2C of capacitor element 2.

First sheet substrate 1 and second sheet substrate 5 that are thus formed are pasted with each other on the side where capacitor electrode terminals of capacitor elements 2 and 3 and an electrode terminal of inductor element 6 are opposed to each other by insulating adhesive resin layer (hereinafter, referred to as "an adhesive layer") 9. In this case, for adhesive layer 9 of a region surrounding the inductor element on at least a side of the inductor element, a material that magnetic powders are dispersed as described below may be used. Then, by interlayer connection conductor 7, one electrode terminal of inductor element 6 is connected to one capacitor electrode terminal of capacitor element 2. In addition, in the same way, by interlayer connection conductor 8, another electrode terminal of inductor element 6 is connected to a capacitor electrode terminal that is elongated from upper electrode layer 2C of capacitor element 2.

As shown in FIG. 1B, on first sheet substrate 1, terminal exposed portion 5A is formed. That is, by arranging a notched portion on a position corresponding to terminal exposed portion 5A of second sheet substrate 5, external connection terminals 10, 11, 12, and 13 formed on first sheet substrate 1 are exposed. By exposed external connection terminals 10, 11, 12, and 13, first sheet substrate 1 is connected to a terminal portion of a wiring pattern of a circuit substrate (not illustrated), respectively. Further, capacitor electrode terminal 4 is a relay terminal for connecting inductor element 6 to external connection terminal 10. In addition, external connection terminals 10 and 11 are connected to a signal terminal of a circuit substrate, for example, and external connection terminals 12 and 13 are connected to a ground terminal of the circuit substrate.

In addition, external connection terminals 10, 11, 12, and 13 may be arranged on another face of first sheet substrate 1 without forming them on a face where capacitor elements 2 and 3 of first sheet substrate 1 are formed as described above. In this case, it is necessary to provide a penetrating conductor on first sheet substrate 1; however, it is not necessary to provide a notched portion on second sheet substrate 5.

In this way, as shown in FIG. 1C, an LC filter of π type configuration as a functional circuit, which is composed of one inductor and two capacitors, can be obtained.

For such composite electronic component 100, the following materials can be used. As first sheet substrate 1 and second sheet substrate 5, for example, a flexible polymer film such as a polyimide film and a polyester film can be used. Lower electrode layers 2A and 3A and upper electrode layers 2C and 3C of capacitor elements 2 and 3 and a conductor of inductor element 6 can be formed by using a material made of aluminum (Al), titanium (Ti), tantalum (Ta), copper (Cu), nickel (Ni), silver (Ag), gold (Au), and an alloy thereof, for example, according to a vapor deposition method and a sputtering method. Further, if necessary, plating or the like may be applied. In addition, a dielectric layer can be formed by using titanium dioxide, strontium titanate, or alumina as a material of a conductor layer according to a sputtering method, a vapor deposition method, or a sol-gel method, for example.

As a material of adhesive layer 9, for example, an epoxy type resin may be used. Alternatively, a rubber type adhesive resin may be used. If an adhesive resin having flexibility is used, after pasting, flexibility can be kept. In addition, an adhesive resin having dispersed magnetic powders, for example, ferrite may be used. In this case, an adhesive resin having large additive amounts of magnetic powders in a region surrounding the inductor element may be used. If such an adhesive resin is used, an inductance value of the inductor element 6 can be made large.

Hereinafter, a method for manufacturing composite electronic component 100 according to the present exemplary embodiment will be described with reference to FIG. 2A to FIG. 2G.

FIGS. 2A to 2G are cross sectional views of main steps for explaining a step to form capacitor elements 2 and 3 on first sheet substrate 1 and to position inductor element 6 formed on second sheet substrate 5 on first sheet substrate 1 to paste it to first sheet substrate 1. Further, FIGS. 2A to 2G show cross sectional views taken along line 1A-1A of FIG. 1B.

Figure 2A:
FIG. 2A is a cross sectional view for explaining a method for manufacturing a composite electronic component according to the first exemplary embodiment of the present invention.
Figure 2B:
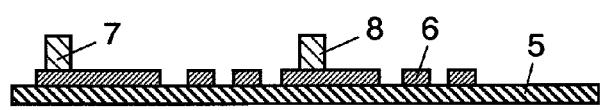
FIG. 2B is a cross sectional view for explaining a method for manufacturing a composite electronic component according to the first exemplary embodiment of the present invention.

FIG. 2A and FIG. 2B are step cross sectional views for explaining a step to arrange interlayer connection conductors 7 and 8 on second sheet substrate 5 on which inductor element 6 is manufactured. In addition, FIGS. 2C to 2F are step cross sectional views for explaining a step to manufacture capacitor elements 2 and 3 on first sheet substrate 1. FIG. 2G is a step cross sectional view for explaining a step to manufacture a composite electronic component by adhering first sheet substrate 1 to second sheet substrate 2 by adhesive layer 9.

At first, as shown in FIG. 2A, inductor element 6 is formed on a main face of second sheet substrate 2. Inductor element 6 can be easily formed by performing etching after copper (Cu) is formed by a sputtering method, for example, and processing it into a spiral shape. In addition, if necessary, plating or the like may be applied.

Next, on one terminal of inductor element 6 and the other terminal located on a center of a spiral, interlayer connection conductors 7 and 8 are arranged, respectively. As these interlayer connection conductors 7 and 8, for example, a conductive adhesive agent may be used. Alternatively, metal columns or resin columns, whose surfaces are plated, or the like may be adhered by a conductive adhesive agent. Alternatively, a bump formed by a wire bonding method may be used. In addition, on second sheet substrate 5, a notched portion is provided on a position corresponding to terminal exposed portion 5A shown in FIG. 1B. Further, the thickness of inductor element 6 is desirably in the range of 5 to 50 μm. In addition, the thicknesses of capacitor elements 2 and 3 are in the range of about 1 to about 10 μm. Accordingly, the thicknesses of interlayer connection conductors 7 and 8 may be in the range of about 6 to about 60 μm.

Next, a step to manufacture capacitor elements 2 and 3 on first sheet substrate 1 will be described.

Figure 2C:
FIG. 2C is a cross sectional view for explaining a method for manufacturing a composite electronic component according to the first exemplary embodiment of the present invention.

As shown in FIG. 2C, on a face of first sheet substrate 1, lower electrode layers 2A and 3A, external connection terminals 12 and 13 connected to these lower electrode layers 2A and 3A, external connection terminals 10 and 11 connected to these upper electrode layers 2C and 3C, and capacitor electrode terminal 4 for relay are formed. Although it is not illustrated, a capacitor electrode terminal for connecting interlayer connection conductor 8 is also formed. They can be easily formed by forming, for example, aluminum (Al) according to a sputtering method and processing it by exposure and an etching process or the like.

With respect to external connection terminals 10, 11, 12, and 13, in order to make connection to the external circuit by soldering or the like possible, after plating nickel (Ni), copper (Cu) and the like, for example, further, external connection terminals 10, 11, 12, and 13 may be formed further by plating gold (Au). Further, this plating may be made after forming capacitor elements 2 and 3.

Figure 2D:
FIG. 2D is a cross sectional view for explaining a method for manufacturing a composite electronic component according to the first exemplary embodiment of the present invention.

Next, as shown in FIG. 2D, dielectric layers 2B and 3B are formed so as to cover lower electrode layers 2A and 3A. Dielectric layers 2B and 3B can be easily formed if, for example, strontium titanate (ST) is formed by a sputtering method and after that, it is processed by exposure and an etching process.

Figure 2E:
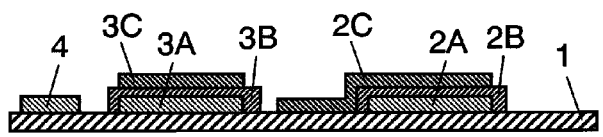
FIG. 2E is a cross sectional view for explaining a method for manufacturing a composite electronic component according to the first exemplary embodiment of the present invention.

Next, as shown in FIG. 2E, upper electrode layers 2C and 3C having areas overlapping lower electrode layers 2A and 3A, respectively, via dielectric layers 2B and 3B are formed. These upper electrode layers 2C and 3C can be formed by the same method as the lower electrode layer. However, when etching processing upper electrode layers 2C and 3C, it is necessary to use a different conductor material so as to prevent lower electrode layers 2A and 3A from being etched or to use a well-known method such as protecting them by a resist or the like.

Figure 2F:
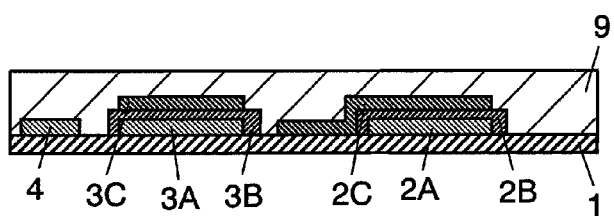
FIG. 2F is a cross sectional view for explaining a method for manufacturing a composite electronic component according to the first exemplary embodiment of the present invention.
Figure 2G:
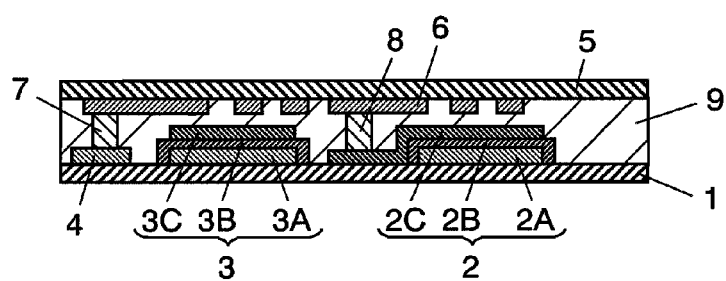
FIG. 2G is a cross sectional view for explaining a method for manufacturing a composite electronic component according to the first exemplary embodiment of the present invention.

Next, as shown in FIG. 2F, adhesive layer 9 is formed on a surface of first sheet substrate 1. This adhesive layer 9 may be formed, for example, by forming an adhesive agent paste according to a printing method or by pasting adhesive sheets having predetermined thicknesses with each other. Further, adhesive layer 9 may be formed on a surface on which interlayer connection conductors 7 and 8 are formed as shown in FIG. 2B.

Next, as shown in FIG. 2G, at the same time as adhering first sheet substrate 1 to second sheet substrate 5, electrical connections between the layers are carried out by interlayer connection conductors 7 and 8. In this case, interlayer connection conductors 7 and 8 are electrically connected to capacitor electrode terminal 4 of first sheet substrate 1 by pressure bonding. However, how to perform electrical connection is not limited to pressure adhering, and for example, a conductive adhesive agent may be used.

As described above, composite electronic component 100 according to the present exemplary embodiment can be manufactured.

According to a method for manufacturing composite electronic component 100 according to the present exemplary embodiment, inductor element 6 is only formed on second sheet substrate 5 and capacitor elements 2 and 3 are only formed on first sheet substrate 1. Accordingly, a film formation process and a processing process on each sheet substrate are simple and no failure is generated in an electronic component of a lower layer by laminating. As a result, it is possible to manufacture composite electronic component 100 with a good yield rate.

Further, composite electronic component according to the present exemplary embodiment can also be manufactured by a method to form first thin film electronic component and second thin film electronic component on each resin sheet using a resin sheet of a long film shape and after that, pasting them with each other.

Figure 3A:
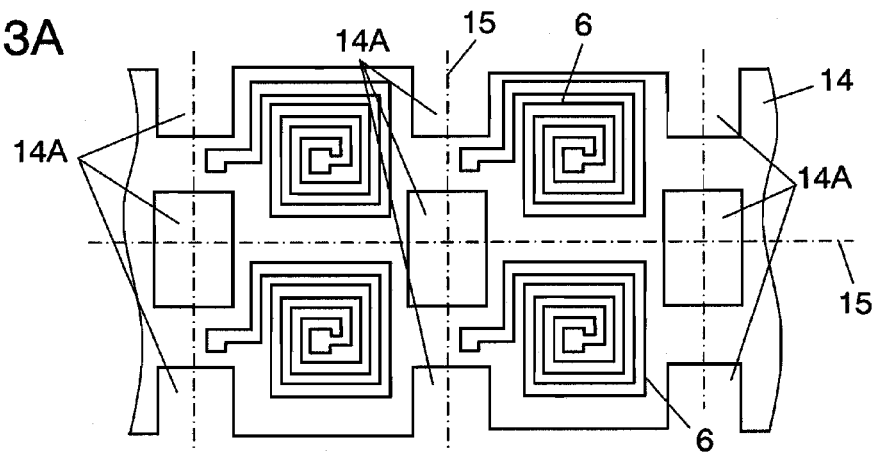
FIG. 3A is a plan view showing a state in which a plurality of inductor elements is formed at a predetermined pitch on a second resin sheet to compose a second sheet substrate according to another method for manufacturing a composite electronic component according to the first exemplary embodiment of the present invention.
Figure 3B:
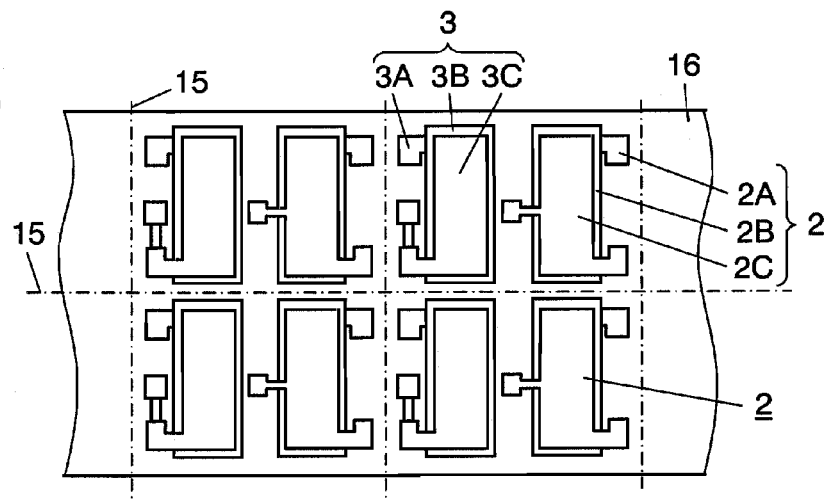
FIG. 3B is a plan view showing a state in which a plurality of capacitor elements is formed on a first resin sheet including a plurality of first sheet substrates according to another method for manufacturing a composite electronic component according to the first exemplary embodiment of the present invention.
Figure 3C:
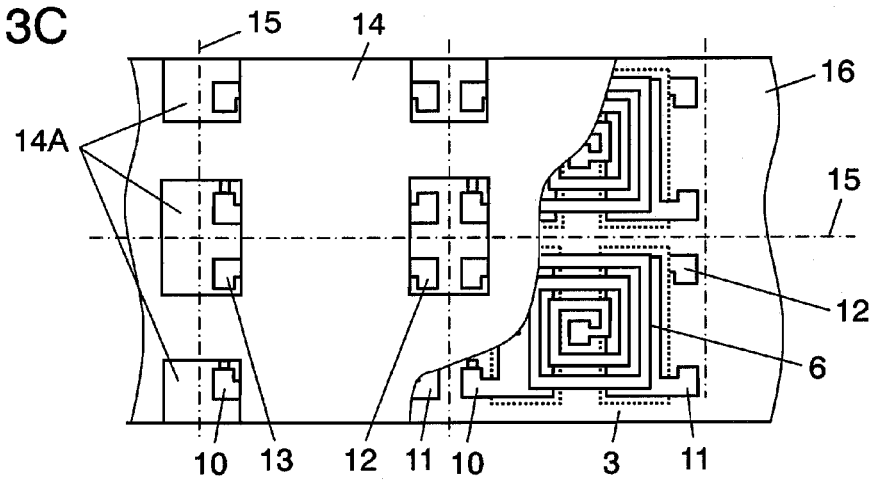
FIG. 3C is a plan view showing a state in which the second resin sheet and the first resin sheet are pasted with each other according to another method for manufacturing a composite electronic component according to the first exemplary embodiment of the present invention.

FIGS. 3A to 3C are plan views of a main step showing an example of the case of forming a composite electronic component by using a resin sheet of a long film shape. That is, this example is formed by a method for collectively manufacturing capacitor elements 2 and 3 and inductor element 6 on surfaces of first resin sheet 16 and second resin sheet 14 of a long film shape at a predetermined pitch, respectively, pasting them with each other, and after that, cutting them into predetermined shapes so as to manufacture composite electronic component 100 of the present exemplary embodiment.

A method for manufacturing composite electronic component 100 of the present exemplary embodiment may comprise a method including the steps of: forming a plurality of capacitor elements 2 and 3 on at least one main face of first resin sheet 16 and external connection terminals 10, 11, 12, and 13 for connecting to an external circuit on the main face or the other face; forming inductor element 6 on at least one main face of second resin sheet 14 and on a position corresponding to capacitor elements 2 and 3; electrically and mechanically connecting interlayer connection conductors 7 and 8 on an electrode terminal, which has been set in advance, of capacitors 2, 3 or inductor element 6; and positioning and pressurizing capacitor elements 2 and 3 and inductor element 6, electrically connecting respective electrode terminals between capacitor elements 2 and 3 and inductor element 6 by interlayer connection conductor elements 7 and 8, and fixing first resin sheet 16 and second resin sheet 14 by adhesive layer 9; and cutting first resin sheet 16 and second resin sheet 14 to make a composite electronic component.

Hereinafter, the method for manufacturing the composite electronic component of the present exemplary embodiment will be described in detail on the basis of FIGS. 3A to 3C.

FIG. 3A shows the state in which a plurality of inductor elements 6 is formed on second resin sheet 14 to form second sheet substrate 5 at a predetermined pitch. In second resin sheet 14, notched portion 14A is formed. When composite electronic component 100 of the present exemplary embodiment is finally formed, this is cut on cut line 15 along a center of this notched portion 14A. That is, the region between cut lines 15 is made into second sheet substrate 5.

FIG. 3B shows the state in which a plurality of capacitor elements 2 and 3 are formed on first resin sheet 16 including first sheet substrate 1 at the same pitch as that of inductor elements 6. This is finally cut by cut line 15 shown in FIG. 3B. That is, the region between cut lines 15 is made into first sheet substrate 1.

FIG. 3C is a view showing a state in which these second resin sheet 14 and first resin sheet 16 are pasted with each other. Further, in order to facilitate understanding, some layers of second resin sheet 14 may be shown being omitted. In the same way, the interlayer connection conductor and the adhesive layer have been formed before pasting as illustrated with reference to FIG. 2A to FIG. 2G. By adhering, one electrode terminal of inductor element 6 and one electrode terminal of capacitor element 3, and another electrode terminal of inductor element 6 and one electrode terminal of capacitor element 2 are connected by interlayer connection conductors 7 and 8, respectively. In addition, since notched portion 14 is provided on second resin sheet 14, the region where external connection terminals 10, 11, 12, and 13 provided in first resin sheet 16 are exposed, namely, terminal exposed portion 5A is formed. After being made into such a state, if the configuration shown in FIG. 3C is cut along cut line 15, it is possible to obtain many composite electronic components 100 shown in FIG. 1A collectively.

Further, according to the present exemplary embodiment, although interlayer connection conductors 7 and 8 are connected to the connection terminal provided on first sheet substrate 1 by pressure bonding, they may be connected with each other by soldering or the conductive adhesive agent. In this case, after they are connected by soldering or the conductive adhesive agent previously, a liquid type adhesive layer 9 may be injected.

In addition, according to the present exemplary embodiment, although the composite electronic component having an LC filter using one inductor element and two capacitor elements is described, the present invention is not limited to this. For example, by arranging a plurality of LC filters, a multiple-configured composite electronic component may be formed.

Second Exemplary Embodiment

FIGS. 4A to 4D show a configuration of composite electronic component 110 according to a second exemplary embodiment of the present invention. The present exemplary embodiment will be described taking the case that the first thin film electronic component is a capacitor element and the second thin film electronic component is an inductor element as an example.

Figure 4A:
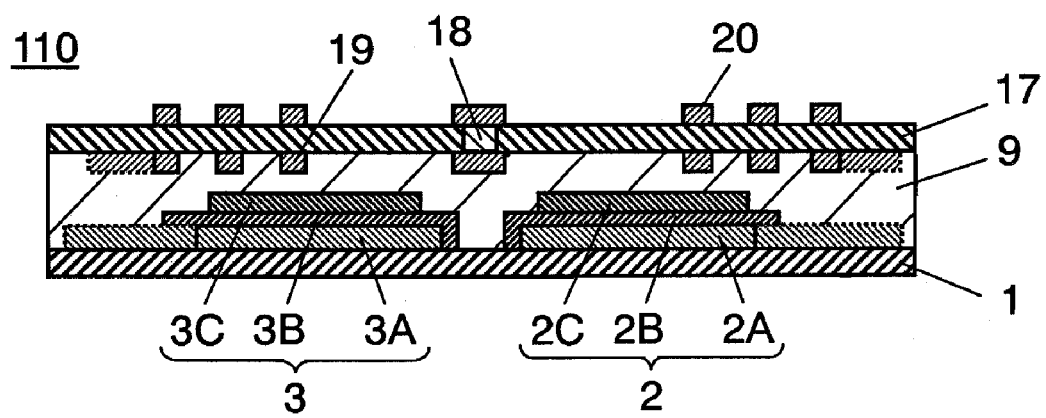
FIG. 4A is a cross sectional view showing a configuration of a composite electronic component according to a second exemplary embodiment of the present invention.
Figure 4B:
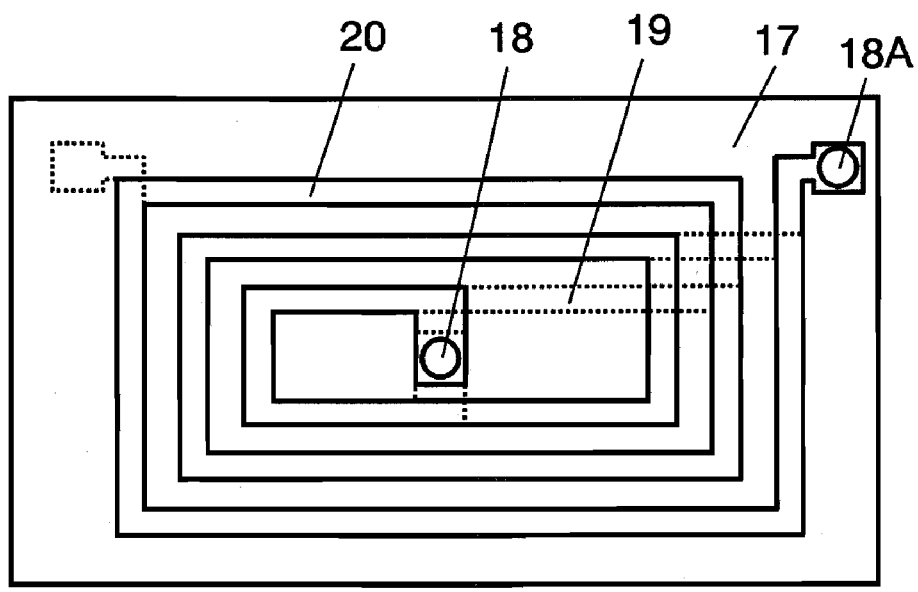
FIG. 4B is a plan view showing a configuration of the second sheet substrate of the composite electronic component according to the second exemplary embodiment of the present invention.
Figure 4C:
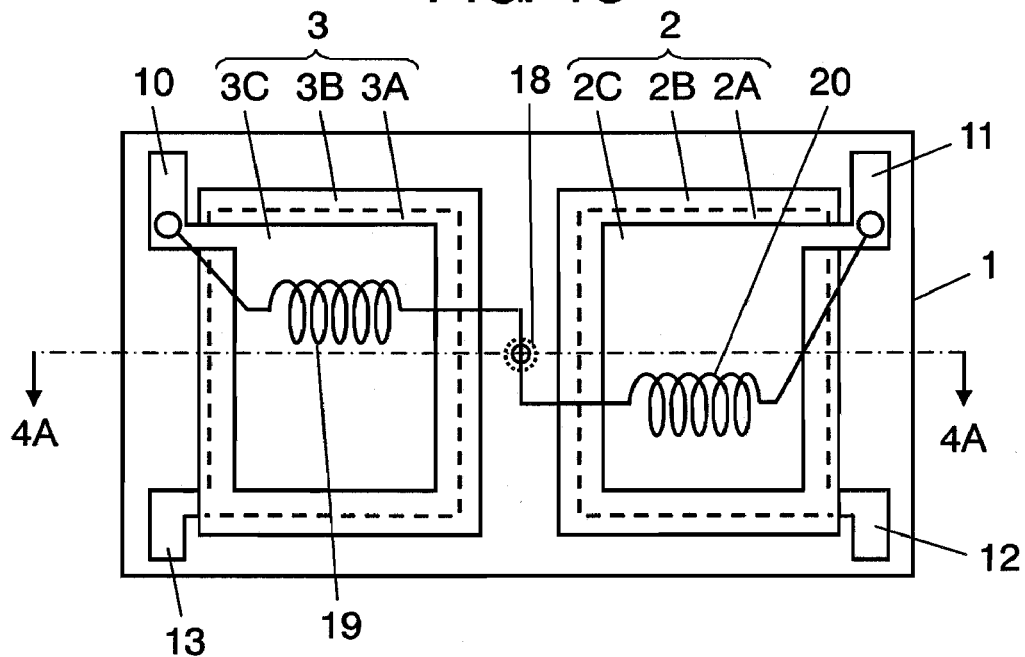
FIG. 4C is a plan view showing a configuration of the first sheet substrate of the composite electronic component according to the second exemplary embodiment of the present invention and a view schematically showing electrical connection to inductor elements when pasting the second sheet substrate.
Figure 4D:
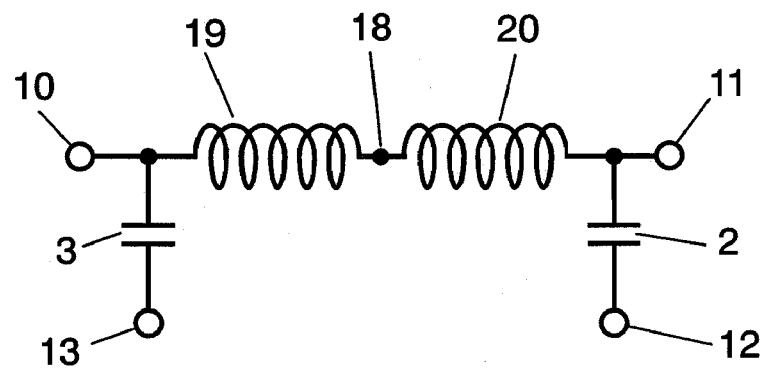
FIG. 4D is an equivalent circuit diagram of the composite electronic component according to the second exemplary embodiment of the present invention.

FIG. 4A is a view showing a cross section along a line 4A-4A of FIG. 4C. However, as described later, FIG. 4C illustrates second sheet substrate 17 merely schematically, so that FIG. 4C is not a precise cross sectional view. FIG. 4B is a plan view showing a configuration of second sheet substrate 17. FIG. 4C is a plan view showing a configuration of first sheet substrate 1, and at the same time, is a view schematically showing electrical connection to inductor elements 19 and 20 when second sheet substrate 17 is pasted to first sheet substrate 1. FIG. 4D is an equivalent circuit diagram.

Composite electronic component 110 according to the present exemplary embodiment is characterized in that the inductance value is made further larger by connecting inductor elements 19 and 20 in series while it has the same shape as that of composite electronic component 100 according to the first exemplary embodiment.

Hereinafter, the present exemplary embodiment will be described defining second thin film electronic components 19 and 20 as inductor elements 19 and 20.

That is, according to the present exemplary embodiment, as shown in FIG. 4A, by forming inductor elements 10 and 20 on each face of second sheet substrate 17 and connecting them by penetrating conductor 18 in series, the number of spiral windings doubled. Accordingly, winding directions of inductor elements 19 and 20 are the same. Thereby, twice the inductance value for the inductance value of inductor element 6 of composite electronic component 100 according to the first exemplary embodiment can be obtained.

As shown in FIG. 4B, inductor elements 19 and 20 are formed on both faces of second sheet substrate 17, and these elements are connected by penetrating conductors 18 and 18A that are provided at the center portion and one end portion of second sheet substrate 17. As being known from FIG. 4B, inductor elements 19 and 20 are connected in series.

As shown in FIG. 4C, on one face of first sheet substrate 1, capacitor elements that are first thin film electronic components 2 and 3 are formed. Hereinafter, first thin film electronic components 2 and 3 will be described as capacitor elements 2 and 3. Since this manufacturing method is the same as the first exemplary embodiment, the explanation thereof is herein omitted. However, they are different in that capacitor electrode terminal 4 is provided in the first exemplary embodiment but this is not provided in the present exemplary embodiment.

Connection between inductor elements 19 and 20 and capacitor elements 2 and 3 will be described with reference to FIG. 4C. One electrode terminal of inductor element 19 is connected to external connection terminal 10 by the interlayer conductor (not shown). Then, the other electrode terminal is connected to one electrode terminal of inductor element 20 via penetrating conductor 18. The other electrode terminal of inductor element 20 is connected to external connection terminal 11 by the interlayer conductor (not shown).

Further, penetrating conductor 18 may be manufactured by defining a penetrating hole in second sheet substrate 17 and forming the conductive thin film also in the penetrating hole on forming inductor elements 19 and 20. Alternatively, before forming inductor elements 19 and 20, penetrating conductor 18 may be formed by a vapor deposition method, a plating method, a printing method or the like.

According to the above-described connection configuration, it is possible to obtain an LC filter of at type configuration, in which inductor elements 19 and 20 are connected in series as shown in the equivalent circuit of FIG. 4D.

Further, also in composite electronic component 110 according to the present exemplary embodiment, the materials and the manufacturing methods of first sheet substrate 1, second sheet substrate 2, capacitor elements 2 and 3, inductor elements 19 and 20, the interlayer connection conductor, the adhesive layer and the like are the same as those of the first exemplary embodiment, so that the explanation thereof is herein omitted.

In addition, also according to the present exemplary embodiment, after forming capacitor elements 2 and 3, inductor elements 19 and 20, respectively, and pasting them with each other by using a resin sheet of a long film shape as shown in FIGS. 3A to 3C as same as the first exemplary embodiment, by cutting them, the composite electronic component can be also manufactured.

In addition, according to the present exemplary embodiment, although composite electronic component 110 of the LC filter configuration basically using one inductor element and two capacitor elements is described, the present invention is not limited to this. For example, by arranging a plurality of LC filters, a multiple-configured composite electronic component may be formed.

Figure 5A:
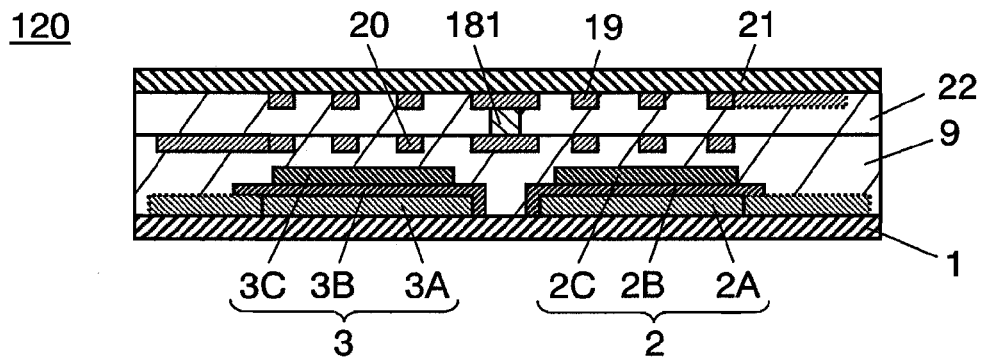
FIG. 5A is a cross sectional view showing a configuration of a composite electronic component according to a first variant example according to the second exemplary embodiment of the present invention.
Figure 5B:
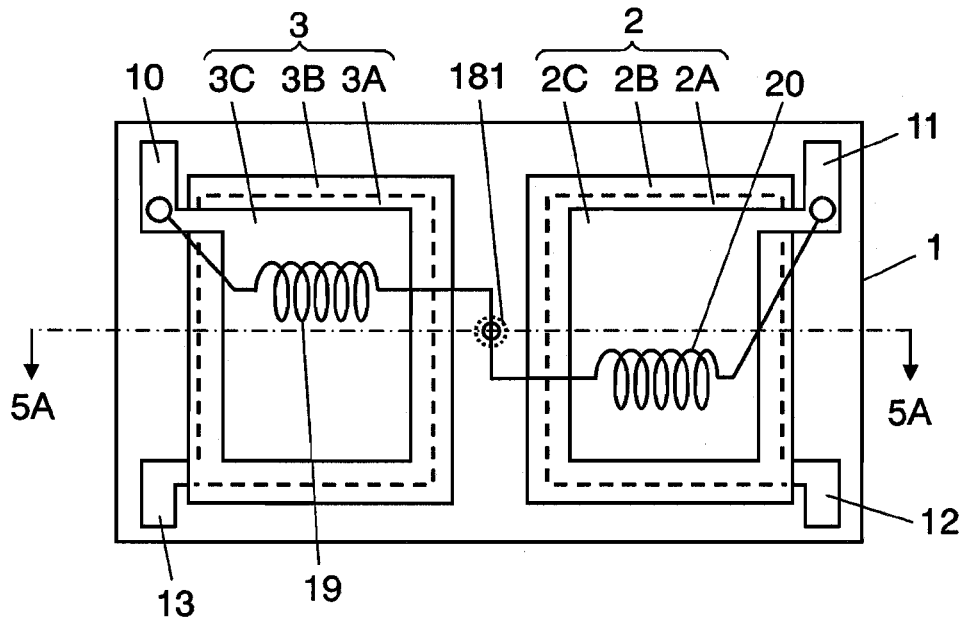
FIG. 5B is a plan view explaining the configuration of the first sheet substrate of the composite electronic component according to the first variant example according to the second exemplary embodiment of the present invention and a view schematically showing electrical connection to an inductor element when pasting the second sheet substrate.
Figure 5C:
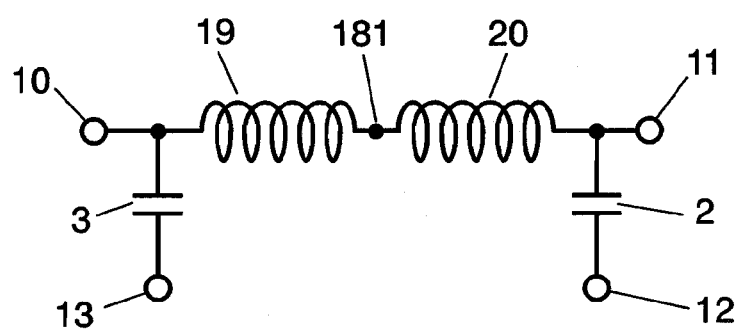
FIG. 5C is an equivalent circuit diagram of the composite electronic component according to the first variant example according to the second exemplary embodiment of the present invention.

FIG. 5A is a cross sectional view showing a configuration of composite electronic component 120 according to a first variant example according to the present exemplary embodiment, FIG. 5B is a plan view explaining the configuration of first sheet substrate 1 and a view schematically showing electrical connection to inductor elements 19 and 20 when second sheet substrate 21 is pasted to first sheet substrate 1, and FIG. 5C is an equivalent circuit diagram. Further, FIG. 5A is a cross sectional view taken along line 5A-5A of FIG. 5B, and includes the configurations of inductor elements 19 and 20.

Also in this composite electronic component 120 of the first variant example, by connecting inductor elements 19 and 20 in series, twice the inductance value for the inductance value of inductor element 6 of composite electronic component 100 according to the first exemplary embodiment can be obtained. Therefore, in composite electronic component 120 of the first variant example, two inductor elements 19 and 20 are laminated on one main face of second sheet substrate 21 via interlayer insulating layer 22 to be formed.

As shown in FIG. 5A, on one main face of second sheet substrate 21, inductor element 19 is formed. On this inductor element 19, interlayer insulating layer 22 is formed. Further, on this interlayer insulating layer 22, inductor element 20 is formed. Thereby, the configuration that two inductor elements 19 and 20 are connected in series on second sheet substrate 21 can be obtained. Further, the basic configuration is the same as those of inductor elements 19 and 20 shown in FIG. 4B.

Next, connection between inductor elements 19 and 20 and capacitor elements 2 and 3 will be described with reference to FIG. 5B. One electrode terminal of inductor element 19 is connected to external connection terminal 10 by the interlayer connection conductor (not shown). Then, the other electrode terminal is connected to one electrode terminal of inductor element 20 by penetrating conductor 181. Another electrode terminal of inductor element 20 is connected to external connection terminal 11 by the interlayer connection conductor (not shown).

Due to the above-described connection configuration, the LC filter of a π type configuration, in which inductor elements 19 and 20 are connected in series as shown in the equivalent circuit of FIG. 5C, can be obtained.

Further, also in this composite electronic component 120 of the first variant example, the materials and the manufacturing methods of first sheet substrate 1, second sheet substrate 21, capacitor elements 2 and 3, inductor elements 19 and 20, the interlayer connection conductor, the adhesive layer and the like are the same as those of the first exemplary embodiment, so that the explanation thereof is herein omitted. In addition, in interlayer insulating layer 22 may be formed by an inorganic dielectric film such as silicon oxide, for example, by a sputtering method. Alternatively, interlayer insulator layer 22 may be formed according to a printing method by using an insulating resin paste. Further, penetrating conductor 181 can be manufactured by providing an opening portion on a predetermined place of interlayer insulating layer 22 and forming a conductive thin film also on the opening portion at the same time on forming inductor element 20. Alternatively, penetrating conductor 181 may be formed according to a vapor deposition method, a plating method, a printing method or the like in advance before forming inductor element 20.

According to the above-described connection configuration, the LC filter of a π type configuration, in which inductor elements 19 and 20 are connected in series as shown in the equivalent circuit of FIG. 5C, can be obtained.

Further, also in this composite electronic component 120 of the first variant example, the materials and the manufacturing methods of first sheet substrate 1, second sheet substrate 21, capacitor elements 2 and 3, inductor elements 19 and 20, the interlayer connection conductor, the adhesive layer and the like are the same as those of the first exemplary embodiment, so that the explanation thereof is herein omitted.

In addition, also in the case of this first variant example, after forming capacitor elements 2 and 3, inductor elements 19 and 20, respectively, and pasting them with each other by using a resin sheet of a long film shape as shown in FIGS. 3A to 3C as same as the first exemplary embodiment, by cutting them, composite electronic component 120 according to the first variant example can be also manufactured.

In addition, according to composite electronic component 120 of the first variant example, although the LC filter configuration basically using one inductor element and two capacitor elements is described, the present invention is not limited to this. For example, by arranging a plurality of LC filters, a multiple-configured composite electronic component may be formed.

Figure 6A:
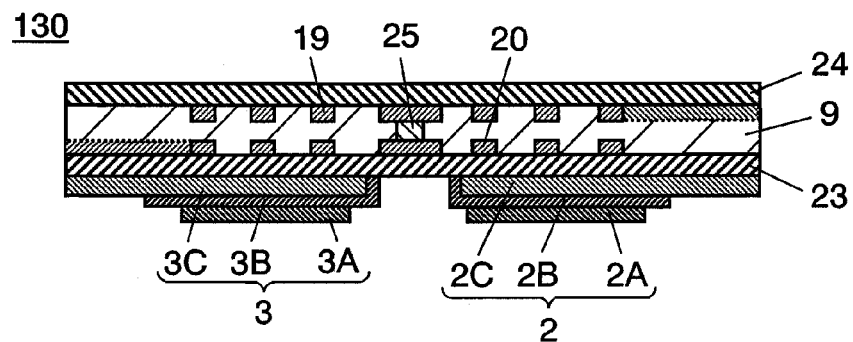
FIG. 6A is a cross sectional view showing a configuration of a composite electronic component according to a second variant example according to the second exemplary embodiment of the present invention.
Figure 6B:
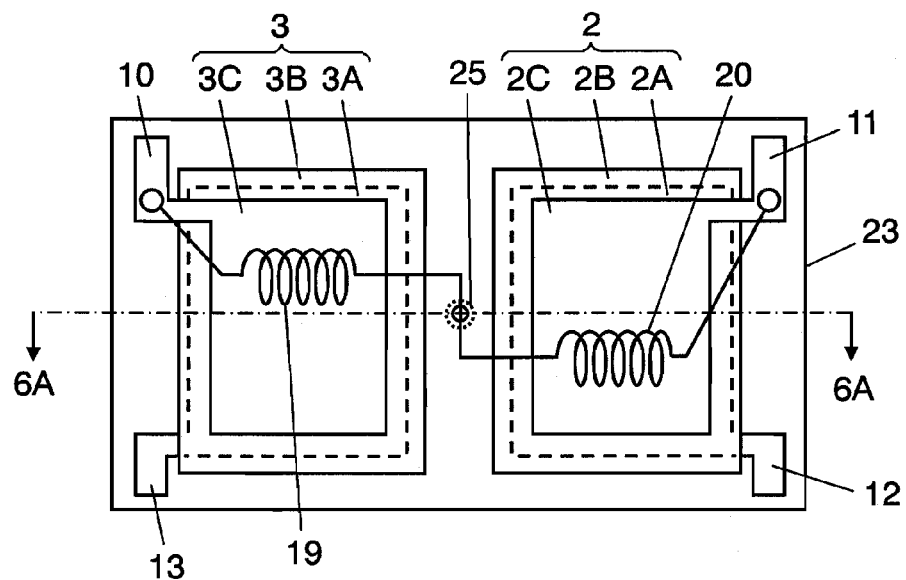
FIG. 6B is a plan view explaining the configuration of the first sheet substrate of the composite electronic component according to the second variant example according to the second exemplary embodiment of the present invention and a view schematically showing electrical connection to an inductor element when pasting the second sheet substrate.
Figure 6C:
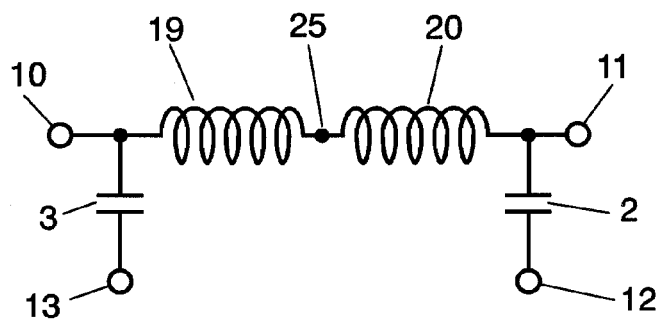
FIG. 6C is an equivalent circuit diagram of the composite electronic component according to the second variant example according to the second exemplary embodiment of the present invention.

FIG. 6A is a cross sectional view showing a configuration of composite electronic component 130 according to a second variant example according to the present exemplary embodiment, FIG. 6B is a plan view explaining the configuration of first sheet substrate 23 and a view schematically showing electrical connection to inductor elements 19 and 20 when second sheet substrate 24 is pasted to first sheet substrate 23, and FIG. 6C is an equivalent circuit diagram. Further, FIG. 6A is a cross sectional view taken along line 6A-6A of FIG. 6B, and includes the configurations of inductor elements 19 and 20.

Also in this composite electronic component 130 of the second variant example, by connecting inductor elements 19 and 20 in series, twice the inductance value for the inductance value of inductor element 6 of composite electronic component 100 according to the first exemplary embodiment can be obtained.

Hereinafter, the configuration of this composite electronic component 130 of the second variant example will be described further in detail.

As shown in FIG. 6A, on one main face of second sheet substrate 24, inductor element 19 is formed. On the other hand, on one main face of first sheet substrate 23, capacitor elements 2 and 3 are formed. In addition, on the other main face, inductor element 20 is formed. Then, first sheet substrate 23 and second sheet substrate 24 are adhered and fixed with each other. Further, the basic configuration is the same as those of inductor elements 19 and 20 shown in FIG. 4B.

On this fixing, interlayer connection between inductor elements 19 and 20 is also carried out. Hereinafter, the connection configuration between inductor elements 19 and 20, capacitor elements 2 and 3, and external connection terminals 10, 11, 12, and 13 will be described. One electrode terminal of inductor element 19 is electrically connected to external connection terminal 10 by the penetrating conductor (not shown) that is arranged on a position of first sheet substrate 23 as schematically shown in FIG. 6B. Then, another electrode terminal of inductor element 19 is electrically connected to one electrode terminal of inductor element 20 by interlayer connection conductor 25. Further, another electrode terminal of inductor element 20 is electrically connected to an electrode terminal for relay (not shown) that is provided on a position of another main face of first sheet substrate 23 by the interlayer connection conductor (not shown). In addition, the electrode terminal for relay (not shown) is electrically connected to external connection terminal 11 via the penetrating conductor (not shown) that is arranged on first sheet substrate 23.

Due to the above-described connection configuration, the LC filter of a π type configuration, in which inductor elements 19 and 20 are connected in series as shown in the equivalent circuit of FIG. 6C, can be obtained.

Further, also in this composite electronic component 130 of the second variant example, the materials and the manufacturing methods of first sheet substrate 23, second sheet substrate 24, capacitor elements 2 and 3, inductor elements 19 and 20, the interlayer connection conductor, the adhesive layer and the like are the same as those of the first exemplary embodiment, so that the explanation thereof is herein omitted.

In addition, also in the case of this second variant example, after forming capacitor elements 2 and 3, inductor elements 19 and 20, respectively, and pasting them with each other by using a resin sheet of a long film shape as shown in FIGS. 3A to 3C as same as the first exemplary embodiment, by cutting them, composite electronic component 130 according to the second variant example can be also manufactured.

In addition, according to composite electronic component 130 of the second variant example, although the LC filter configuration basically using one inductor element and two capacitor elements is described, the present invention is not limited to this. For example, by arranging a plurality of LC filters, a multiple-configured composite electronic component may be formed.

Further, according to the present exemplary embodiment, although the case of manufacturing an LC filter of a π type configuration is described, the present invention is not limited to this. For example, an LC filter of T type can be manufactured in the same way. In the case of this LC filter of T type, a multiple-configuration is possible.

Third Exemplary Embodiment

Figure 7A:
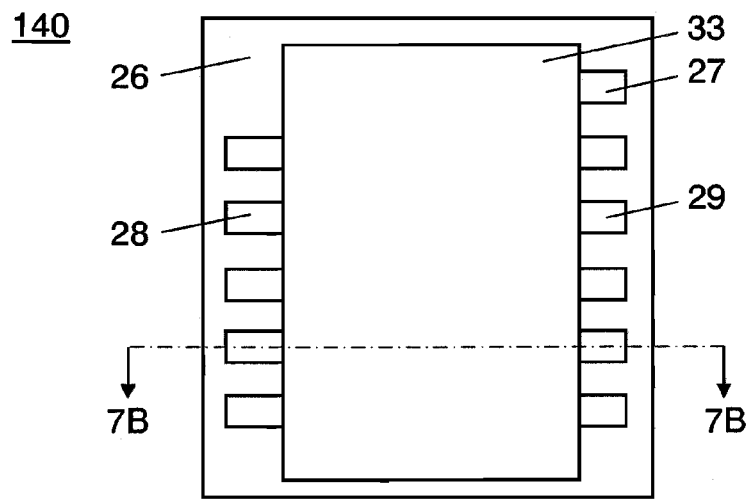
FIG. 7A is a plan view as seen from the side of a second sheet substrate for explaining a configuration of a composite electronic component according to a third exemplary embodiment of the present invention.
Figure 7B:
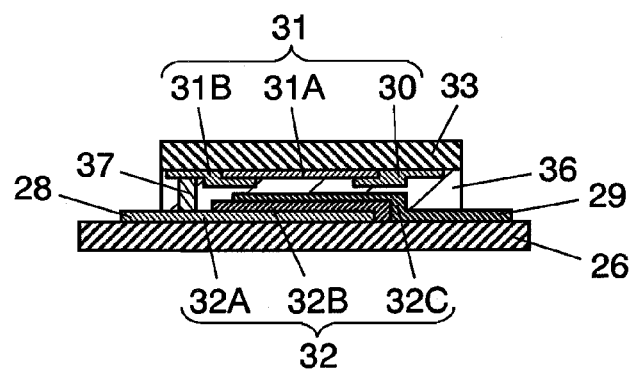
FIG. 7B is a cross sectional view taken along line 7B-7B of FIG. 7A.

FIG. 7A is a plan view as seen from the side of second sheet substrate 33 for explaining a configuration of composite electronic component 140 according to a third exemplary embodiment of the present invention. FIG. 7B is a cross sectional view taken along line 7B-7B of FIG. 7A, and FIG. 7C is an equivalent circuit diagram thereof.

Composite electronic component 140 according to the present exemplary embodiment is configured in such a manner that capacitor element 32 that is a first thin film electronic component formed on first sheet substrate 26 is electrically connected to resistor element 31 that is a second thin film electronic component formed on second sheet substrate 33 by interlayer connection conductor 37, and first sheet substrate 26 and second sheet substrate 33 are adhered and fixed by insulating adhesive resin layer 36. Hereinafter, the first thin film electronic component will be described as capacitor element 32 and the second thin film electronic component will be described as resistor element 31.

Figure 7C:
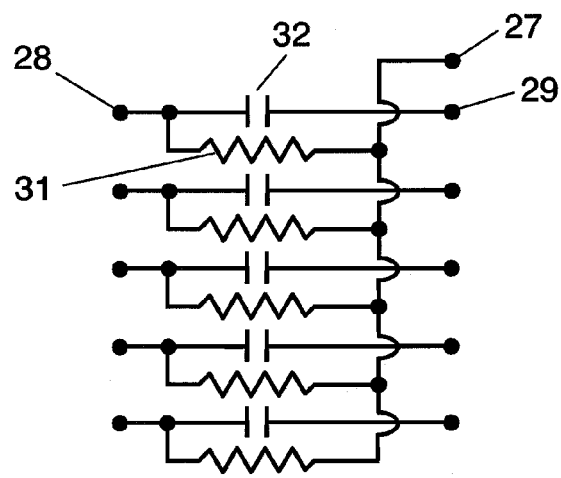
FIG. 7C is an equivalent circuit diagram of the composite electronic component according to the third exemplary embodiment of the present invention.

Further, as seen from FIGS. 7A to 7C, in composite electronic component 140 according to the present exemplary embodiment, five capacitor elements 32 and five resistor elements 31 are provided, respectively. Then, as also shown in the equivalent circuit diagram of FIG. 7C, an elongated portion of lower electrode layer 32A is connected to external connection terminal 28, and an elongated portion of upper electrode layer 32C is connected to external connection terminal 29.

In addition, one electrode terminal 30 of each resistor element 31 is connected in common, and as shown in FIG. 7C, one electrode terminal 30 is connected to external connection terminal 27 that is a ground terminal via interlayer connection conductor 37. On the contrary, another electrode terminal 31B of each resistor element 31 and the elongated portion of lower electrode layer 32A of capacitor element 32 are electrically connected with each other by interlayer connection conductor 37 in the same way.

Then, external connection terminals 27, 28, and 29 are exposed even after pasting second sheet substrate 33, so that external connection terminals 27, 28, and 29 can be easily connected to the external circuit.

Thereby, composite electronic component 140 of a multiple CR high-pass filter configuration can be obtained. This composite electronic component 140 can be made thinner to a large extent as compared to a CR filter composed of a conventional chip component, and if this composite electronic component 140 is arranged below a semiconductor chip, a connector device or the like, for example, with hardly increasing the entire thickness, an electronic circuit device with a high density can be realized.

FIGS. 8A to 10B are views for explaining a method for manufacturing composite electronic component 140 according to the present exemplary embodiment.

Figure 8A:
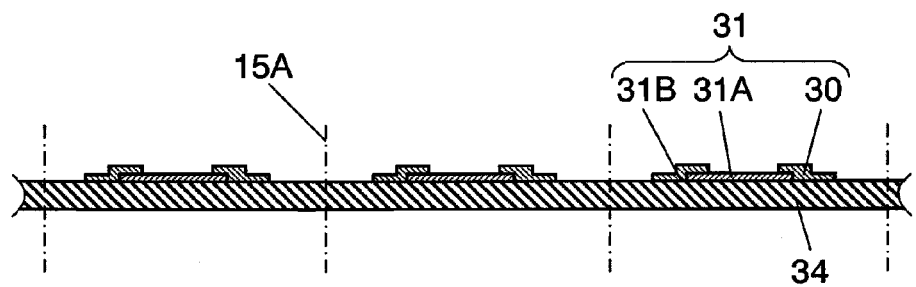
FIG. 8A is a cross sectional view showing a state in which a resistor element is formed at a predetermined pitch on a second resin sheet of a long film shape in a method for manufacturing the composite electronic component according to the third exemplary embodiment of the present invention.
Figure 8B:
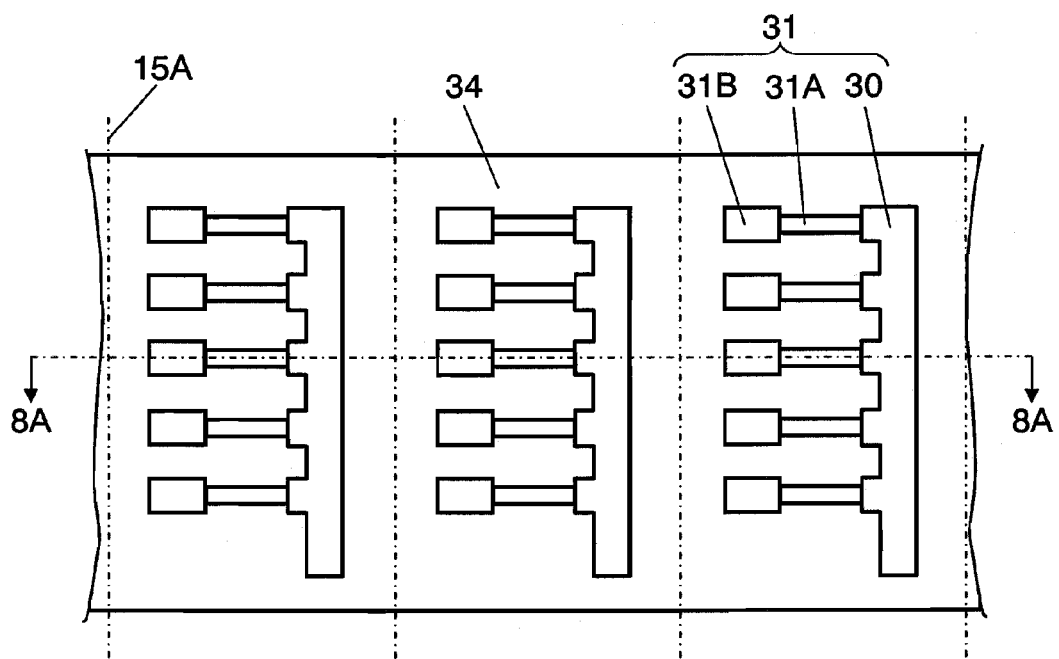
FIG. 8B is a plan view showing a state in which a resistor element is formed at a predetermined pitch on the second resin sheet of a long film shape in a method for manufacturing the composite electronic component according to the third exemplary embodiment of the present invention.

FIG. 8A and FIG. 8B are views showing a state in which resistor element 31 is formed on second resin sheet 34 of a long film shape at a predetermined pitch. Then, FIG. 8A is a cross sectional view taken along line 8A-8A shown in FIG. 8B, and FIG. 8B is a plan view.

Resistor element 31 is configured by another independent electrode terminal 31B, electrode terminals 30 that are entirely connected in common, and resistor layer 31A connected between both electrode terminals 30 and 31B. This resistor element 31 can be formed in such a manner that, after forming a material to be made into resistor layer 31A, for example, Nichrome by a sputtering method and further a material to be made into the one electrode terminal 30 and the other electrode terminal 31B, for example, Aluminum (Al) by a sputtering method, an exposure processing and an etching process are carried out. Further, when composite electronic component 140 is pasted with first resin sheet 35, after cutting second resin sheet 34 along cut line 15A to be made into a state of second sheet substrate 33, they are pasted with each other.

Figure 9A:
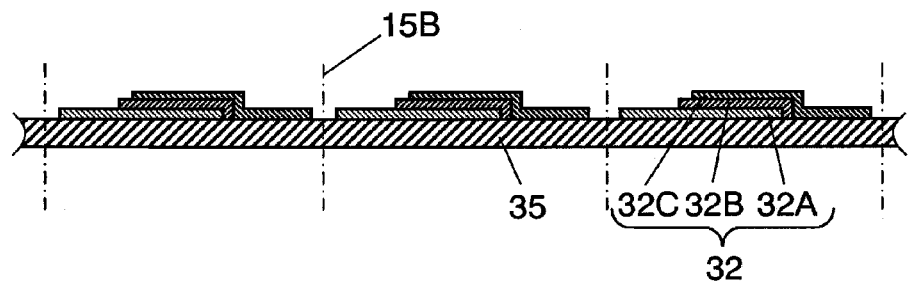
FIG. 9A is a cross sectional view showing a state in which a capacitor element is formed on a first resin sheet of a long film shape at a pitch corresponding to the resistor element formed on the second resin sheet in the method for manufacturing the composite electronic component according to the third exemplary embodiment of the present invention.
Figure 9B:
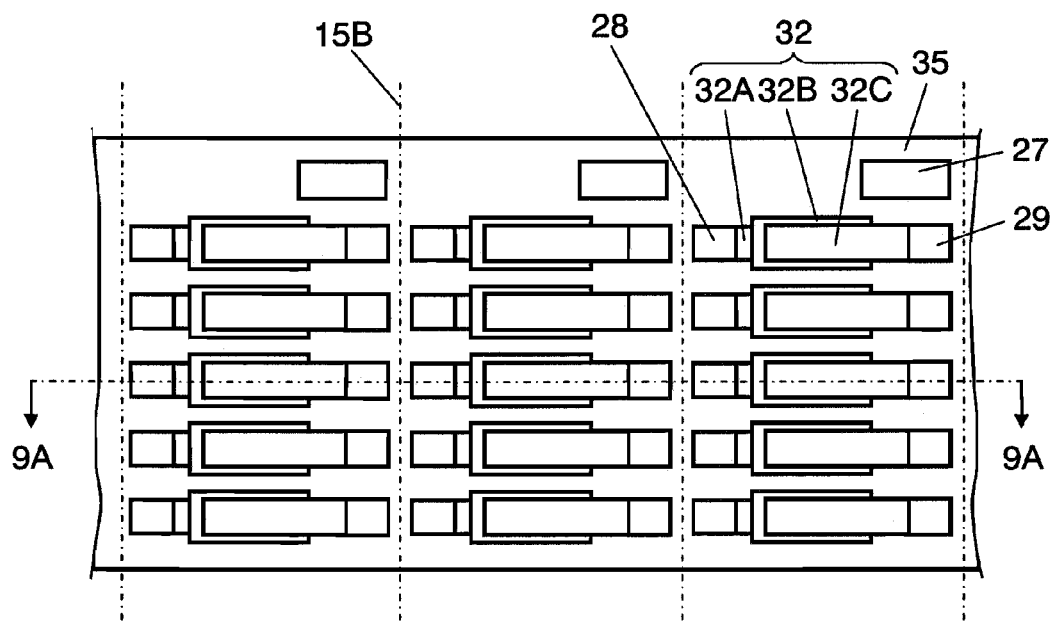
FIG. 9B is a plan view showing a state in which a capacitor element is formed on the first resin sheet of a long film shape at the pitch corresponding to the resistor element formed on the second resin sheet in the method for manufacturing the composite electronic component according to the third exemplary embodiment of the present invention.

FIG. 9A and FIG. 9B are views showing a state in which capacitor element 32 is formed on first resin sheet 35 of a long film shape at a pitch corresponding to resistor element 31 that is formed on second resin sheet 34. Then, FIG. 9A is a cross sectional view taken along line 9A-9A shown in FIG. 9B, and FIG. 9B is a plan view.

Capacitor element 32 is formed as well as the first exemplary embodiment in such a manner that lower electrode layer 32A, dielectric layer 32B, and upper electrode layer 32C are laminated on first resin sheet 35 and a predetermined pattern processing is applied. Each of these capacitor elements 32 is formed into an individual pattern shape. Then, the elongated portions of lower electrode layer 32A are connected to individual external connection terminals 28, respectively. In addition, the elongated portions of upper electrode layer 32C are connected to individual external connection terminals 29, respectively. Further, in the region where external connection terminals 29 are formed, external connection terminal 27, which is connected to electrode terminal 30 of resistor element 31 and is made into a ground terminal, is arranged.

Figure 10A:
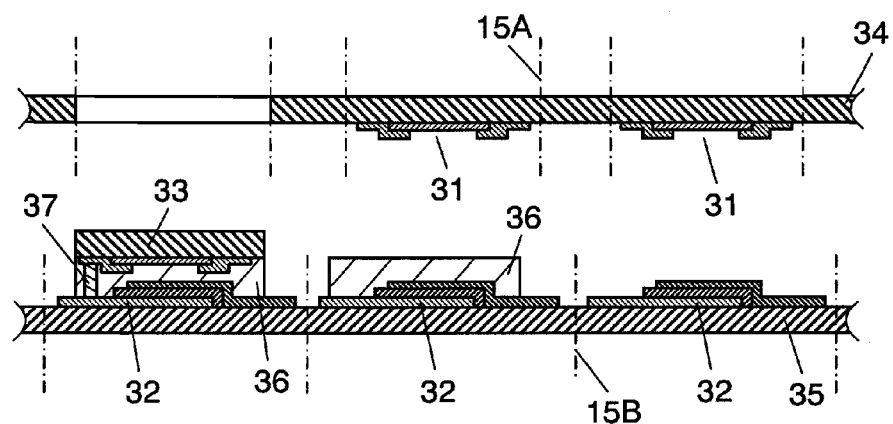
FIG. 10A is a cross sectional view of the first resin sheet and the second resin sheet for explaining a step for pasting the second sheet substrate that is cut from the second resin sheet along a cut line to a first resin sheet to be manufactured with each other in the method for manufacturing the composite electronic component according to the third exemplary embodiment of the present invention.
Figure 10B:
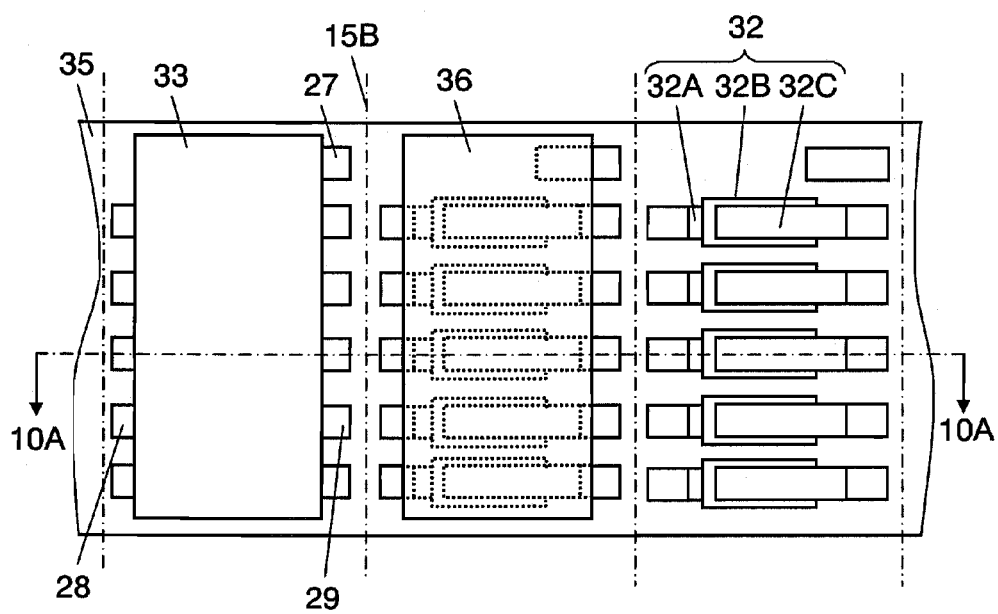
FIG. 10B is a plan view for explaining a step for pasting the second sheet substrates that is cut from the second resin sheet along a cut line to be manufactured with the first resin sheet with each other in a method for manufacturing the composite electronic component according to the third exemplary embodiment of the present invention.

FIG. 10A and FIG. 10B are views for explaining a step for pasting second sheet substrate 33 that is manufactured by being cut from second resin sheet 34 along cut line 15A to first resin sheet 35. FIG. 10A is a cross sectional view taken along line 10A-10A shown in FIG. 10B, and FIG. 10B is a plan view.

As shown in a left side of FIG. 10A and FIG. 10B, after cutting from second resin sheet 34 of a long shape along cut line 15A and obtaining second sheet substrate 33 on which resistor element 31 is formed, second sheet substrate 33 is pasted to a face of first resin sheet 35. In this case, interlayer connection conductor 37 is electrically connected and fixed on a surface of one electrode terminal 30 and a surface of another electrode terminal 31B of resistor element 31 in advance, respectively. Further, interlayer connection conductor 37 to be fixed on the surface of electrode terminal 30 may be provided on a position opposed to the elongated portion of external connection terminal 27 by one. Further, on a face on which capacitor element 32 of first resin sheet 35 is formed, adhesive layer 36 has been formed.

Then, on first resin sheet 35, second sheet substrate 33 is adhered, and electrical connection between the layers is carried out by interlayer connection conductor 37. In this connection, one electrode terminal 30 of each resistor element 31 is electrically connected to external connection terminal 27 that is a ground terminal by interlayer connection conductor 37. On the other hand, another electrode terminal 31B of each resistor element 31 is electrically connected to the elongated portion of lower electrode layer 32A of capacitor element 32 corresponding to this, respectively, by interlayer connection conductor 37.

Since interlayer connection conductor 37 and adhesive layer 36 can use the materials and the connection methods that have been described according to the first and second exemplary embodiments, the explanation thereof is herein omitted. In addition, adhering and electrical connection methods of second sheet substrate 33 on first resin sheet 35 are the same as that of the first exemplary embodiment, so that the explanation thereof is also herein omitted.

In the same way, second sheet substrate 33 is adhered and fixed also to other places on first resin sheet 35. After that, if first resin sheet 35 is cut along cut line 15B, composite electronic component 140 shown in FIG. 7A can be obtained. Further, a width of second resin sheet 34 is determined to be smaller than a width of first resin sheet 35 by an area on which external connection terminals 27, 28, and 29 are exposed.

By defining such a manufacturing method, capacitor element 32 and resistor element 31 are manufactured on a different resin sheet, respectively, so that not only each step is simplified but also a failure is hardly generated in a midstream of the step. In addition, since the electronic components can be collectively manufactured by using a resin sheet of a large area, a mass productivity can be improved.

Further, according to the above-described manufacturing method, each group of resistor element 31 formed on second resin sheet 34 and capacitor element 32 formed on first resin sheet 35 is defined to be one array; however, two and more arrays may be available.

Furthermore, according to the present exemplary embodiment, although a method for cutting second resin sheet 34 to be made into second sheet substrate 24 and after that, adhering it to first resin sheet 35 is used, the present invention is not limited to this. For example, if a notched portion, namely, an opening portion is provided on a position corresponding to the external connection terminal to be formed on first resin sheet 35 in advance, by pasting second resin sheet 34 to first resin sheet 35, collectively adhering and electrically connecting them, and after that, by cutting a composite electronic component, it is possible to manufacture many composite electronic components at the same time.

In addition, in the present exemplary embodiment, a multiple CR filter configuration has been described; however, it may be only one or more of them may be available.

Fourth Exemplary Embodiment

Figure 11A:
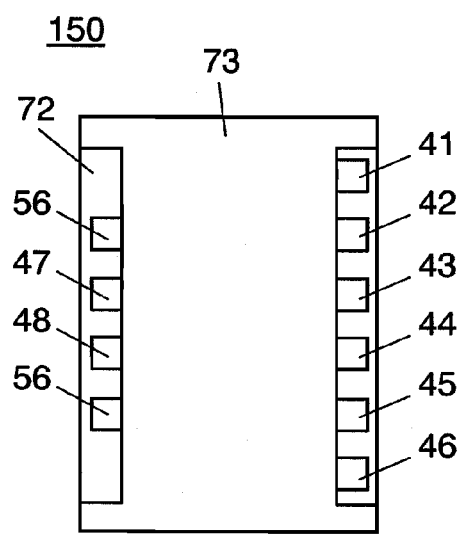
FIG. 11A is a plan view for explaining a configuration of a composite electronic component according to a fourth exemplary embodiment of the present invention.
Figure 11B:
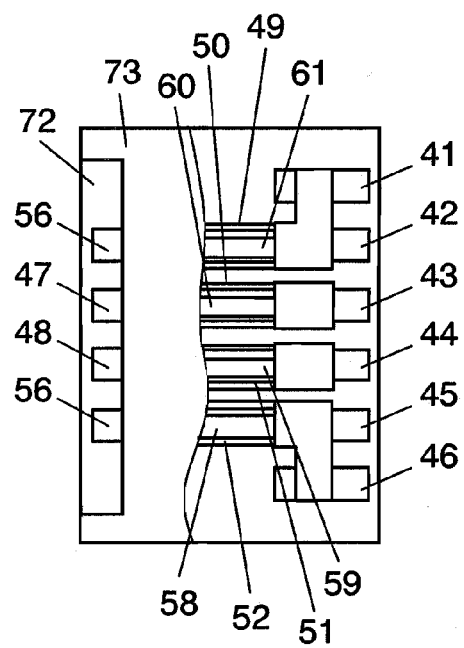
FIG. 11B is a plan view for showing an inner configuration partially notching the second sheet substrate of the composite electronic component according to the fourth exemplary embodiment of the present invention.
Figure 11C:
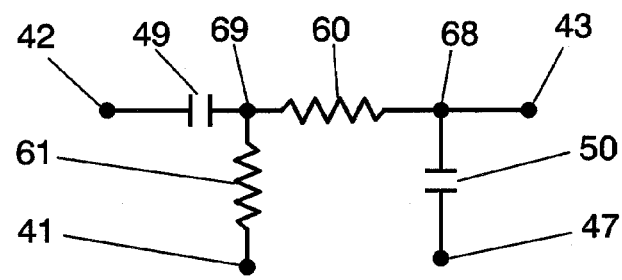
FIG. 11C is an equivalent circuit diagram of the composite electronic component according to the fourth exemplary embodiment of the present invention.
Figure 11C:
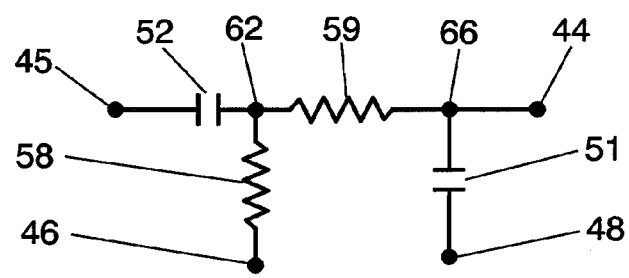

FIG. 11A is a plan view for explaining a configuration of composite electronic component 150 according to a fourth exemplary embodiment of the present invention. Then, FIG. 11B is a plan view for showing an inner configuration partially notching second sheet substrate 73, and FIG. 11C is an equivalent circuit diagram. Composite electronic component 150 according to the present exemplary embodiment is an example that a functional circuit composed of two band pass filters is configured. Also according to the present exemplary embodiment, the case that a capacitor element is taken as an example of the first thin film electronic component and the case that a resistor element is taken as an example of the second thin film electronic component will be described. As shown in FIG. 11A and FIG. 11B, two band pass filters shown in the equivalent circuit diagram of FIG. 11C are formed in such a manner that four capacitor elements 49, 50, 51, and 52 are formed on first sheet substrate 72, and second sheet substrate 73, on which resistor elements 58, 59, 60, and 61 are formed, is pasted thereon, and interlayer connection of a predetermined place is carried out.

Further, external connection terminals 41, 46, 47, and 48 are ground terminals. Then, external connection terminals 42, 43, 44, and 45 are input and output terminals, and external connection terminal 56 is a dummy terminal and is not connected to the external circuit.

Figure 12A:
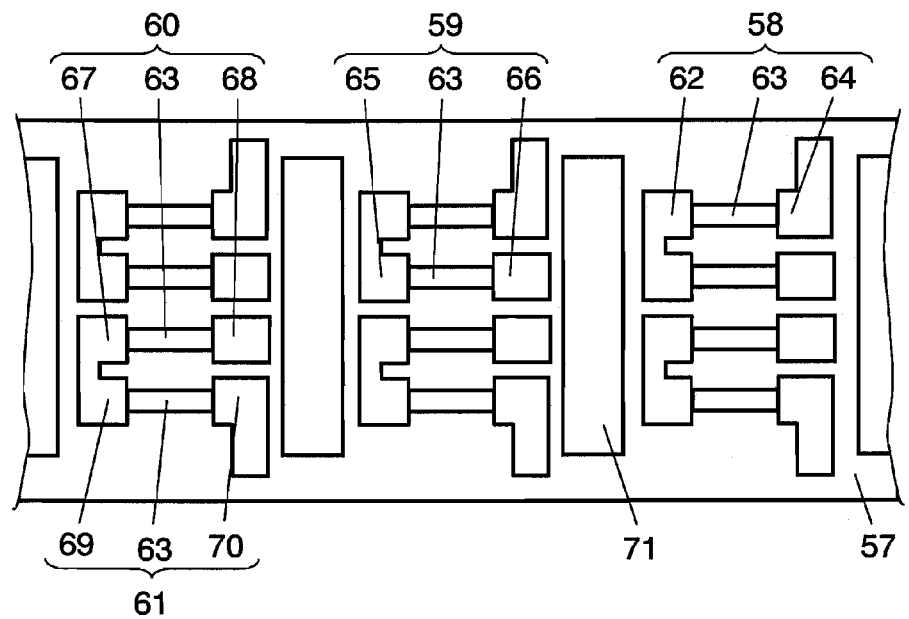
FIG. 12A is a view showing a configuration of respective thin film electronic components of the composite electronic component according to the fourth exemplary embodiment of the present invention and showing a state in which an array of four resistor elements is formed at a predetermined alignment pitch on the second resin sheet for explaining the configuration of connection of respective thin film electronic components.
Figure 12B:
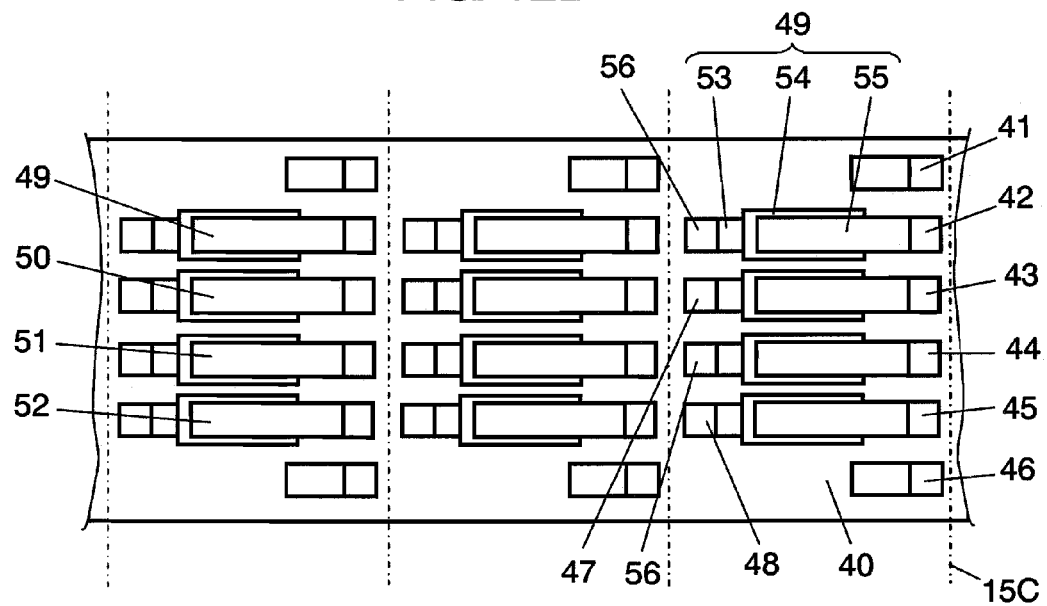
FIG. 12B is a view showing a configuration of respective thin film electronic components of the composite electronic component according to the fourth exemplary embodiment of the present invention and showing a state in which a capacitor element is formed on a position corresponding to the resistor element on the first resin sheet for explaining the configuration of connection of respective thin film electronic components.

Hereinafter, with reference to FIG. 12A and FIG. 12B, the configurations of capacitor elements 49, 50, 51 and 52, resistor elements 58, 59, 60 and 61, and connection thereof will be described. FIG. 12A and FIG. 12B are views for explaining the configuration of each thin film electronic component of the composite electronic component according to the present exemplary embodiment and the connection configuration thereof.

FIG. 12A is a view showing a state in which four resistor element arrays are formed at a predetermined alignment pitch on second resin sheet 57. Resistor element 58 is formed by electrode terminals 62 and 64, and resistor layer 63. In addition, resistor element 59 is formed by electrode terminals 65 and 66, and resistor layer 63. In addition, resistor element 60 is formed by electrode terminals 67 and 68, and resistor layer 63. In addition, resistor element 61 is formed by electrode terminals 69 and 70 and resistor layer 63.

These resistor elements 58, 59, 60, and 61 can be manufactured by forming a film according to a sputtering method by using Nichrome as resistor layer 63 and Aluminum (Al) as electrode terminals 62, 64, 65, 66, 67, 68, 69, and 70, for example, and after that, carrying out an exposure process and an etching process. In order to obtain a desired resistor value, by varying a shape, a resistor value of each resistor element can be determined. Further, as resistor layer 63, its material is not limited to Nichrome and if it is a material that has been generally used as a thin film resistor, it is available. Further, the material as electrode terminals 62, 64, 65, 66, 67, 68, 69, and 70 is also not limited to Aluminum (Al) but a metal material and an alloy material such as copper (Cu), nickel (Ni)

and gold (Au) can be used. In addition, not only a single layer configuration but also a laminated configuration may be available.

Further, as shown in FIG. 12A, on second resin sheet 57, notched portion 71, namely, an opening portion according to the present exemplary embodiment is provided on a predetermined place. Since this notched portion 71 is provided, many composite electronic components 150 can be collectively manufactured by adhering second resin sheet 57 on first resin sheet 40, and then, cutting it along cut line 15C.

FIG. 12B is a view showing a state in which capacitor elements 49, 50, 51, and 52 are formed in positions corresponding to resistor elements 58, 59, 60, and 61 on first resin sheet 40. Capacitor elements 49, 50, 51, and 52 are configured by lower electrode layer 53, dielectric layer 54, and upper electrode layer 55. The materials and the manufacturing methods of these capacitor elements 49, 50, 51, and 52 are the same as those of the first exemplary embodiment, so that the explanation thereof is herein omitted.

Lower electrode layer 53 of capacitor element 49 is elongated to be connected to external connection terminal 56, and the elongated portion of upper electrode layer 55 is connected to external connection terminal 42. In addition, lower electrode layer 53 of capacitor element 50 is elongated to be connected to external connection terminal 47, and the elongated portion of upper electrode layer 55 is connected to external connection terminal 43. Further, lower electrode layer 53 of capacitor element 51 is elongated to be connected to external connection terminal 56, and the elongated portion of upper electrode layer 55 is connected to external connection terminal 44. In addition, lower electrode layer 53 of capacitor element 52 is elongated to be connected to external connection terminal 48, and the elongated portion of upper electrode layer 55 is connected to external connection terminal 45.

The connection configuration between the layers on pasting first resin sheet 40 and second resin sheet 57 will be described below.

For resistor element 58, this electrode terminal 62 is connected to the elongated portion of lower electrode layer 53 of capacitor element 52. In addition, the elongated portion of electrode terminal 64 is connected to the elongated portion of external connection terminal 46.

For resistor element 59, this electrode terminal 66 is connected to the elongated portion of upper electrode layer 55 of capacitor element 51. In addition, electrode terminal 62 is connected to electrode terminal 65 from the beginning.

For resistor element 61, this electrode terminal 69 is connected to the elongated portion of lower electrode layer 53 of capacitor element 49. In addition, the elongated portion of electrode terminal 70 is connected to the elongated portion of external connection terminal 41.

For resistor element 60, this electrode terminal 68 is connected to the elongated portion of upper electrode layer 55 of capacitor element 50. In addition, electrode terminal 67 is connected to electrode terminal 69 from the beginning.

According to the above-mentioned connection, two band pass filters shown in FIG. 11C can be obtained. Further, the materials of the interlayer connection conductor (not shown) and the adhesive layer (not shown), and a adhering and electrical connection method using them are the same as those of the first exemplary embodiment, so that the explanation thereof is herein omitted.

On first resin sheet 40, by manufacturing a band pass filter configuration and then cutting it along cut line 15C, composite electronic component 150 shown in FIG. 11A is obtained. Composite electronic component 150 according to the present exemplary embodiment has a very thin type configuration, but it has two band pass filters, so that this composite electronic component 150 can facilitate reduction in size of various electronic circuits.

Further, according to the present exemplary embodiment, although two band pass filters are described, the present invention is not limited to this. Only one band pas filter may be available, or three or more band pass filters may be available. In addition, according to the manufacturing method of the present exemplary embodiment, although an example that the resistor element and the capacitor element forming one group is formed into one array, two or more arrays can be manufactured by the same step.

In addition, the connection configuration between the resistor element and the capacitor element is not limited to the present exemplary embodiment, and further various connection configurations can be used.

Fifth Exemplary Embodiment

Figure 13A:
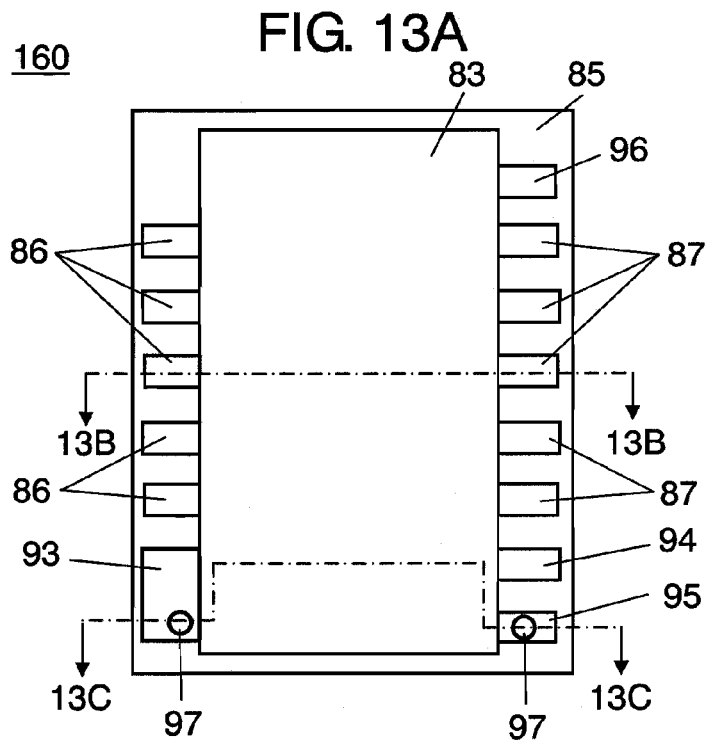
FIG. 13A is a plan view for explaining a configuration of a composite electronic component according to a fifth exemplary embodiment of the present invention.
Figure 13B:
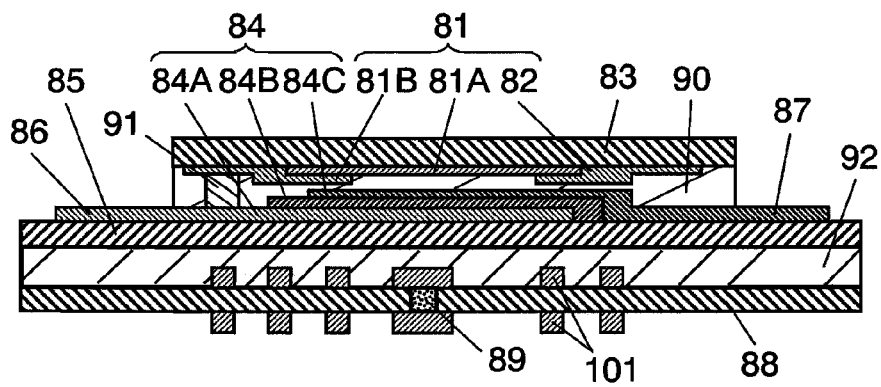
FIG. 13B is a cross sectional view taken along line 13B-13B of FIG. 13A.
Figure 13C:
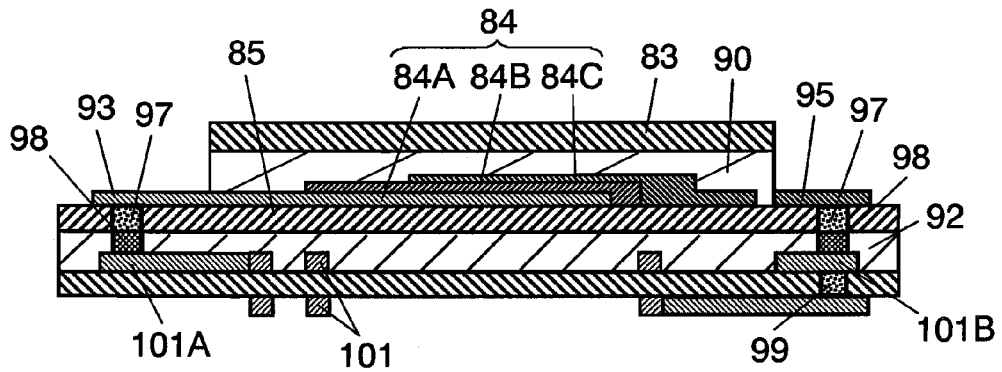
FIG. 13C is a cross sectional view taken along line 13C-13C of FIG. 13A.
Figure 14:
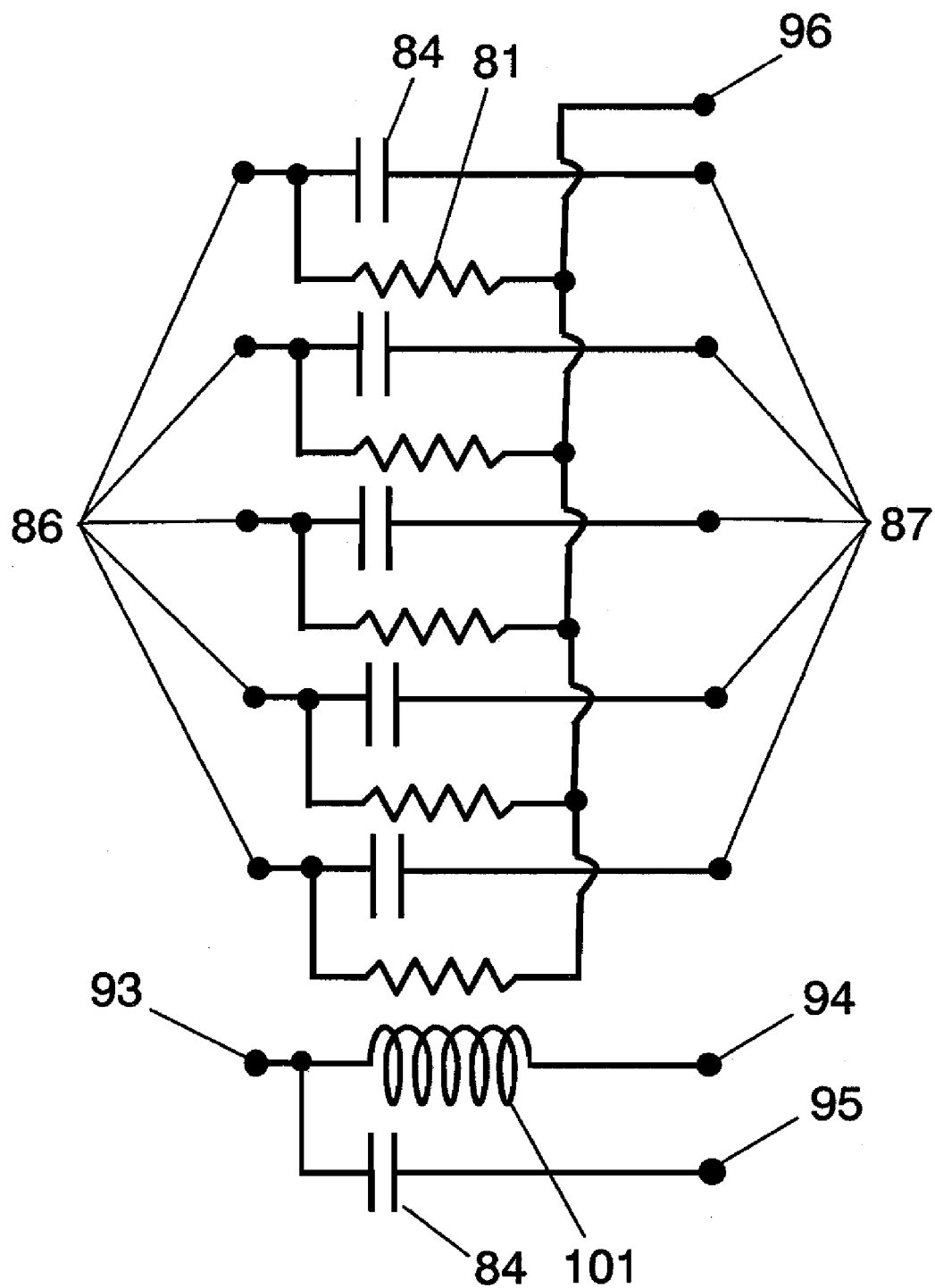
FIG. 14 is an equivalent circuit diagram of the composite electronic component according to the fifth exemplary embodiment of the present invention.
Figure 15A:
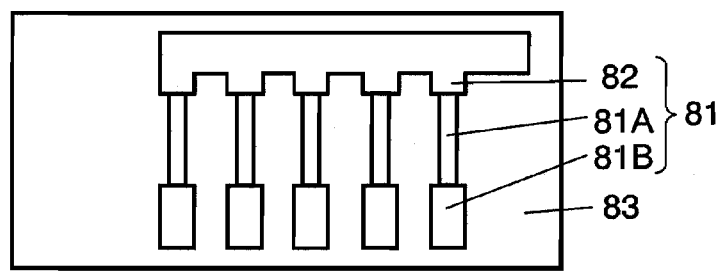
FIG. 15A is a plan view showing a configuration of a second thin film electronic component formed on the second sheet substrate used for the composite electronic component according to the fifth exemplary embodiment of the present invention.
Figure 15B:
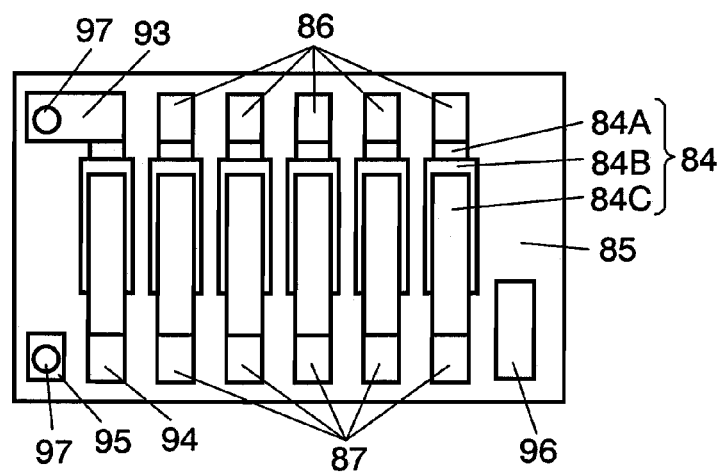
FIG. 15B is a plan view showing a configuration of a first thin film electronic component formed on the first sheet substrate used for the composite electronic component according to the fifth exemplary embodiment of the present invention.
Figure 15C:
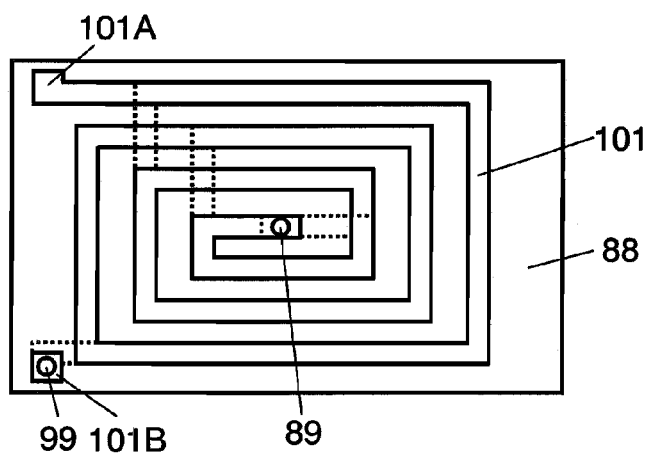
FIG. 15C is a plan view showing a configuration of third thin film electronic components formed on the third sheet substrate used for the composite electronic component according to the fifth exemplary embodiment of the present invention.

FIGS. 13A to 13C are views explaining a configuration of composite electronic component 160 according to a fifth exemplary embodiment of the present invention. FIG. 13A is a plan view as seen from the side of second sheet substrate 83. FIG. 13B is a cross sectional view taken along line 13B-13B of FIG. 13A. Then, FIG. 13C is a cross sectional view taken along line 13C-13C of FIG. 13A. In addition, FIG. 14 is an equivalent circuit diagram of this composite electronic component 160. Further, FIGS. 15A to 15C are views for explaining a configuration of each sheet substrate used for composite electronic component 160 according to the present exemplary embodiment. FIG. 15A is a plan view showing a configuration of a second thin film electronic component formed on second sheet substrate 83. FIG. 15B is a plan view showing a configuration of a first thin film electronic component formed on first sheet substrate 85. Then, FIG. 15C is a plan view showing a configuration of a third thin film electronic component formed on third sheet substrate 88.

Composite electronic component 160 according to the present exemplary embodiment is provided with first sheet substrate 85 on which a plurality of first thin film electronic components 84 is formed on at least one main face, second sheet substrate 81 on which a plurality of second thin film electronic components 81 is formed on at least one main face, and third sheet substrate 88 on which third thin film electronic component 101 is formed on at least one main face. Then, as shown in FIG. 13B, first sheet substrate 85 and second sheet substrate 83, and first sheet substrate 85 and third sheet substrate 88 are pasted with each other via adhesive layers 90 and 92, respectively. Further, composite electronic component 160 according to the present exemplary embodiment is configured in such a manner that first thin film electronic component that has been set in advance among a plurality of first thin film electronic components 84 and second thin film electronic component 81, and first thin film electronic component that has been set in advance and third thin film electronic component 101 are electrically connected.

According to the present exemplary embodiment, on first sheet substrate 85, as first thin film electronic component 84, six capacitor elements are formed. Hereinafter, first thin film electronic component 84 is referred to as capacitor element 84. In addition, on second sheet substrate 83, as second thin film electronic component 81, five resistor elements are formed. Hereinafter, second thin film electronic component 81 is referred to as resistor element 81. Further, on third sheet substrate 88, as third thin film electronic component 101, one inductor element is formed. Hereinafter, third thin film electronic component 101 is referred to as inductor element 101.

Here, as shown in FIG. 15B, on first sheet substrate 85, six capacitor elements 84 are formed. Capacitor element 84 is configured with laminating lower electrode layer 84A, dielectric layer 84B, and upper electrode layer 84C.

In addition, on one main face of first sheet substrate 85, on which capacitor element 84 is formed, external connection terminals 86, 87, 93, 94, 95 and 96 are formed. External connection terminal 86 is connected to lower electrode layer 84A of capacitor element 84, and external connection terminal 87 is connected to upper electrode layer 84C of capacitor element 84. Further, capacitor element 84 on the left side shown in FIG. 15B is only connected to inductor element 101, and another capacitor element 84 is connected to resistor element 81. On external connection terminals 93 and 95, penetrating conductor 97 is formed.

In addition, as shown in FIG. 15A, resistor element 81 is configured by independent another electrode terminal 81B, one electrode terminals 82 that are entirely connected in common, and resistor layer 81A connected to one electrode terminal 82 and another electrode terminal 81B. The elongated portion of one electrode terminals 82 is arranged so as to be capable of being connected to external connection terminal 96 that is provided on first sheet substrate 85.

Further, as shown in FIG. 15C, inductor element 101 having two terminal patterns 101A and 101B provided on the same face is formed on both faces of third sheet substrate 88 in a coil shape to be connected in series by penetrating conductor 89. Then, a coil pattern formed on a rear face is connected to terminal pattern 101B formed on a surface via penetrating conductor 99.

First sheet substrate 85, second sheet substrate 83, and third sheet substrate 88 are configured as described above, and by pasting them with each other and electrically connecting predetermined devices with each other, composite electronic component 160 according to the present exemplary embodiment is obtained. That is, by electrically connecting capacitor element 84 of first sheet substrate 85 with resistor element 81 of second sheet substrate 83, five CR filters as shown in FIG. 14 are configured. In addition, by electrically connecting capacitor element 84 of first sheet substrate 85 with inductor element 101 of third sheet substrate 88, one LC filter as shown in FIG. 14 is configured. That is, composite electronic component 160 according to the present exemplary embodiment is composed of five CR filters and one LC filter.

External connection terminal 86 is connected to lower electrode layer 84A of capacitor element 84. Further, this external connection terminal 86 is also connected to another electrode terminal 81B of resistor element 81 via interlayer connection conductor 91. In addition, respective external connection terminals 87 are connected to upper electrode layer 84C of capacitor element 84, respectively. In one electrode terminal 82 of resistor element 81, as shown in FIG. 15A, all of five resistor elements 81 are connected in common, and connected to external connection terminal 96 via an interlayer connection conductor (not shown). Further, external connection terminal 93 is connected to lower electrode layer 84A of capacitor element 84. Further, this external connection terminal 93 is connected to one terminal pattern 101A of inductor element 101 via penetrating conductor 97 and interlayer connection conductor 98. In addition, external connection terminal 94 is connected to upper electrode layer 84C of capacitor element 84. On the other hand, external connection terminal 95 is connected to another terminal pattern 101B of inductor element 101 via penetrating conductor 97 and interlayer connection conductor 98. External connection terminals 86, 87, 93, 94, 95 and 96, capacitor element 84, resistor element 81 and inductor element 101 are connected as described above. Here, external connection terminals 86 and 93 are input terminals, external connection terminals 87 and 94 are output terminals, and then, external connection terminals 95 and 96 are ground terminals.

According to the above-described configuration, by forming only capacitor element 84 on first sheet substrate 85, only resistor element 81 on second sheet substrate 83, and only inductor element 101 on third sheet substrate 88, pasting each of them, and electrically connecting them with each other, it is possible to form composite electronic component 160 having five CR filters and one LC filter. This composite electronic component 160 can be made thinner to a large extent as compared to a composite circuit of a CR filter and an LC filter composed of a conventional chip component, and for example, composite electronic component 160 can be easily arranged beneath a semiconductor chip, a connector device or the like, for example. Accordingly, hardly increasing the thickness of the entire circuit, it is possible to realize an electronic circuit device with a high density.

As described according to the first exemplary embodiment or the like, composite electronic component 160 according to the present exemplary embodiment can be manufactured by pasting and cutting after forming capacitor element 84, resistor element 81 and inductor element 101 on each sheet by using first resin sheet, second resin sheet and third resin sheet of a long film shape, respectively. In addition, also with respect to the materials, the manufacturing methods and the like of capacitor element 84, resistor element 81 and inductor element 101, the same material and manufacturing method as those of the first exemplary embodiment can be used, so that the explanation thereof is herein omitted.

According to the first to fifth exemplary embodiments, an example that the external connection terminal is formed on a formation face of a capacitor element of the first sheet substrate has been described. However, the present invention is not limited to this. The configuration that the external connection terminal is formed on the face at the opposite side of the formation face of the capacitor element, and the capacitor element and the resistor element are connected by the penetrating conductor may be available. In addition, on the side of the second sheet substrate, the external connection terminal may be provided. Alternatively, in the case of the fifth exemplary embodiment, the external connection terminal may be provided on the side of the third sheet substrate.

In addition, according to the first exemplary embodiment and the second exemplary embodiment, the example of the LC filter circuit has been described, and according to the third exemplary embodiment and the fourth exemplary embodiment, the example of the CR filter circuit has been described. Further, according to the fifth exemplary embodiment, the example of the composite electronic component including the CR filter circuit and the LC filter circuit has been described. However, the present invention is not limited to the above-described LC filter circuit, CR filter circuit, and these composite circuits or the number of elements. According to the composite electronic component of the present invention, after forming the thin electronic component on each sheet substrate, by adhering and electrically connecting them, the functional circuit is configured. Accordingly, the thin film electronic component may be a semiconductor thin film functional device or a sensor element without being limited to the above-described capacitor element, resistor element, and inductor element, As a semiconductor thin film functional device, for example, forming a plurality of thin film transistors on the first sheet substrate or the second sheet substrate, and forming a resistor element, a capacitor element, an inductor element or a sensor element on the second sheet substrate or the first sheet substrate, if they are adhered and at the same time predetermined places are electrically connected, a higher functional composite electronic component can be obtained.

In addition, forming thin film electronic components having different functions, respectively, on both faces of the first sheet substrate, the second first sheet substrate and the third sheet substrate, and electrically connecting them, a functional circuit may be configured. For example, forming a capacitor element and an inductor element on each face of the first sheet substrate, and forming capacitor elements having different resistor elements and capacitance values on each face of the second sheet substrate, they may be electrically connected by the interlayer connection conductor to form a functional circuit.

In addition, although the first to fifth exemplary embodiments have been described taking a method for adhering an interlayer connection conductor by a conductive adhesive agent or adhering a metal column or a resin column of which surface is plated or the like by a conductive adhesive agent has been described as an example, the present invention is not limited to this. For example, when forming the external connection terminal, the connection conductor having the same height as that of the interlayer connection conductor that has been described according to the above-described exemplary embodiment may be formed on an electrode terminal face to be electrically connected. Alternatively, the external connection terminal may be provided on any of the first sheet substrate, the second sheet substrate and the third sheet substrate.

The sheet-like composite electronic component according to the present invention is a composite electronic component whose thickness and size are reduced and function is high. Therefore, the sheet-like composite electronic component according to the present invention is useful for the field of electronic equipment such as mobile equipment or the like, whose reduction in size, reduction in thickness, and high performance are further required.

The invention claimed is:

1. A sheet-like composite electronic component comprising:
    a first sheet substrate, on which a first thin film electronic component is formed on at least one main face and an external connection terminal for connecting to an external circuit is formed on the one main face or the other main face;
    a second sheet substrate, on which a second thin film electronic component is formed on at least one main face; and
    an insulating adhesive resin layer for fixing the first sheet substrate and the second sheet substrate opposing the first thin film electronic component against the second thin film electronic component;
    wherein the first thin film electronic component and the second thin film electronic component have different functions, respectively, and by electrically connecting them, a functional circuit is formed; and
    wherein the functional circuit is one of a plurality of functional circuits provided to be made into a multiple-configuration.

2. The sheet-like composite electronic component according to claim 1, wherein the first thin film electronic component and the second thin film electronic component are any one selected from a group consisting of a capacitor element, an inductor element, a resistor element, a semiconductor thin film functional device and a sensor element.

3. The sheet-like composite electronic component according to claim 1, wherein the first thin film electronic component is a capacitor element, the second thin film electronic component is an inductor element, and the functional circuit is an LC filter circuit.

4. The sheet-like composite electronic component according to claim 1, wherein the first thin film electronic component or the second thin film electronic component is an inductor element, and the insulating adhesive resin layer is made of a material in which magnetic powders are dispersed.

5. The sheet-like composite electronic component according to claim 4, wherein, as the insulating adhesive resin layer, a material having additive amounts of magnetic powders in a region surrounding the inductor element is used.

6. A sheet-like composite electronic component comprising:
    a first sheet substrate, on which a first thin film electronic component is formed on at least one main face and an external connection terminal for connecting to an external circuit is formed on the one main face or the other main face;
    a second sheet substrate, on which a second thin film electronic component is formed on at least one main face; and
    an insulating adhesive resin layer for fixing the first sheet substrate and the second sheet substrate opposing the first thin film electronic component against the second thin film electronic component,
    wherein the first thin film electronic component and the second thin film electronic component have different functions, respectively, and by electrically connecting them, a functional circuit is formed; and
    wherein the first thin film electronic component is a capacitor element, the second thin film electronic component is a resistor element, and the functional circuit is a CR filter circuit.

7. A sheet-like composite electronic component comprising:
    a first sheet substrate, on which a first thin film electronic component is formed on at least one main face and an external connection terminal for connecting to an external circuit is formed on the one main face or the other main face;
    a second sheet substrate, on which a second thin film electronic component is formed on at least one main face; and
    an insulating adhesive resin layer for fixing the first sheet substrate and the second sheet substrate opposing the first thin film electronic component against the second thin film electronic component;
    wherein the external connection terminal is formed at the main face of the first sheet substrate, on which the first thin film electronic component is formed; and
        wherein at the second sheet substrate, a region corresponding to the external connection terminal is notched, and when the first sheet substrate and the second sheet substrate are adhered and fixed with the insulating adhesive resin layer, the external connection terminal is exposed.

8. A method for manufacturing a sheet-like composite electronic component comprising:
    forming a plurality of first thin film electronic components on at least one main face of a first resin sheet, and an external connection terminal for connecting to an external circuit on the main face or the other face;

forming a second thin film electronic component on at least one main face of a second resin sheet and on a position corresponding to one of the first thin film electronic components;

electrically and mechanically connecting an interlayer connection conductor on an electrode terminal, which has been set in advance, of said one of the first thin film electronic components or the second thin film electronic component;

positioning and pressurizing said one of the first thin film electronic components and the second thin film electronic component, electrically connecting respective electrode terminals between said one of the first thin film electronic components and the second thin film electronic component with the interlayer connection conductor, and fixing the first resin sheet and the second resin sheet with an insulating adhesive resin layer; and cutting the first resin sheet and the second resin sheet to make a composite electronic component.

9. The method for manufacturing a sheet-like composite electronic component according to claim 8, further comprising:

forming the external connection terminal on the main face of the first sheet substrate; and forming a notched portion on a region corresponding to the external connection terminal on the second resin sheet;

wherein the fixing step is implemented after forming the notched portion.

* * * * *